(12) United States Patent
Jeong et al.

(10) Patent No.: US 7,276,731 B2
(45) Date of Patent: Oct. 2, 2007

(54) WIRING LINE ASSEMBLY AND METHOD FOR MANUFACTURING THE SAME, AND THIN FILM TRANSISTOR ARRAY SUBSTRATE HAVING THE WIRING LINE ASSEMBLY AND METHOD FOR MANUFACTURING THE SAME

(75) Inventors: Chang-Oh Jeong, Suwon (KR); Bong-Joo Kang, Seoul (KR); Jae-Gab Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/053,833

(22) Filed: Feb. 10, 2005

(65) Prior Publication Data
US 2005/0145844 A1 Jul. 7, 2005

Related U.S. Application Data

(63) Continuation of application No. 10/112,760, filed on Apr. 2, 2002, now Pat. No. 6,867,108.

(30) Foreign Application Priority Data
Apr. 13, 2001 (KR) .............................. 2001-19874

(51) Int. Cl.
*H01L 29/04* (2006.01)
(52) U.S. Cl. .................... 257/59; 257/72; 257/258; 349/42; 349/147
(58) Field of Classification Search ................ 257/59, 257/72, 258; 349/147, 42
See application file for complete search history.

(56) References Cited

U.S. PATENT DOCUMENTS
5,667,853 A * 9/1997 Fukuyoshi et al. ........ 428/1.62
(Continued)

FOREIGN PATENT DOCUMENTS
JP        61222978       * 10/1986
(Continued)

*Primary Examiner*—Evan Pert
*Assistant Examiner*—Tan Tran
(74) *Attorney, Agent, or Firm*—F. Chau & Assoc., LLC

(57) ABSTRACT

In a method for fabricating a thin film transistor array substrate, a glass substrate undergoes an oxygen plasma treatment. A silver or silver alloy-based conductive layer is deposited onto the substrate, and patterned to thereby form a gate line assembly proceeding in the horizontal direction. The gate line assembly includes gate lines, gate electrodes, and gate pads. Thereafter, a silicon nitride-based gate insulating layer is deposited onto the substrate, and a semiconductor layer and an ohmic contact layer are sequentially formed on the gate insulating layer. The semiconductor layer and the ohmic contact layer are HF-treated. A silver alloy-based conductive layer is deposited onto the substrate, and patterned to thereby form a data line assembly. The data line assembly includes data lines crossing over the gate lines, source electrodes, drain electrodes, and data pads. A protective layer based on silicon nitride or an organic material is deposited onto the substrate, and patterned through dry etching such that the protective layer bears contact holes exposing the drain electrodes, the gate pads and the data pads, respectively. An indium zinc oxide or indium tin oxide-based layer is deposited onto the substrate, and patterned to thereby form pixel electrodes, and subsidiary gate and data pads. The pixel electrodes are electrically connected to the drain electrodes, and the subsidiary gate and data pads to the gate and data pads.

18 Claims, 41 Drawing Sheets

U.S. PATENT DOCUMENTS

| | | | |
|---|---|---|---|
| 5,985,700 A | 11/1999 | Moore | 438/149 |
| 5,998,229 A | 12/1999 | Lyu et al. | 438/30 |
| 6,087,678 A * | 7/2000 | Kim | 257/59 |
| 6,274,412 B1 | 8/2001 | Kydd et al. | 438/149 |
| 6,674,495 B1 | 1/2004 | Hong et al. | 349/43 |
| 6,674,502 B1 * | 1/2004 | Terakado et al. | 349/147 |
| 6,723,281 B1 | 4/2004 | Ueno et al. | 420/503 |
| 2001/0029054 A1 * | 10/2001 | Maeda et al. | 438/17 |
| 2002/0106586 A1 | 8/2002 | You | 430/311 |

FOREIGN PATENT DOCUMENTS

| | | |
|---|---|---|
| JP | 61222978 A | 10/1986 |
| JP | 2003342653 A | 12/2003 |
| WO | WO 3098641 A1 | 11/2003 |

\* cited by examiner

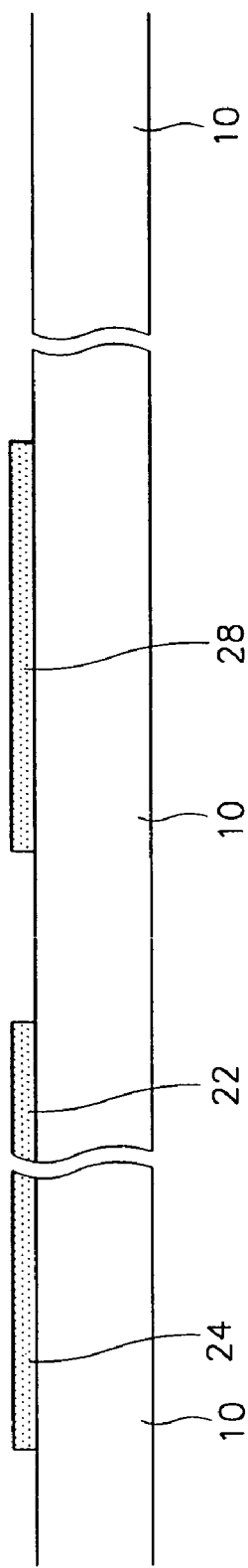

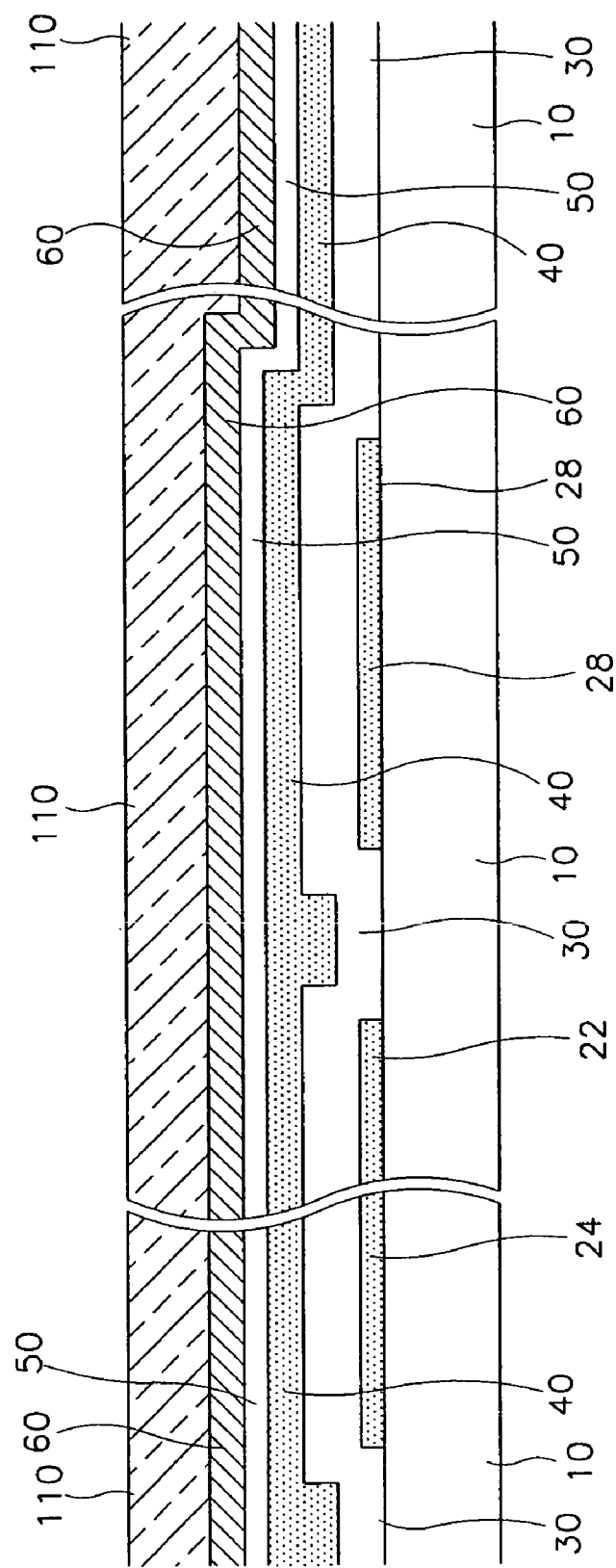

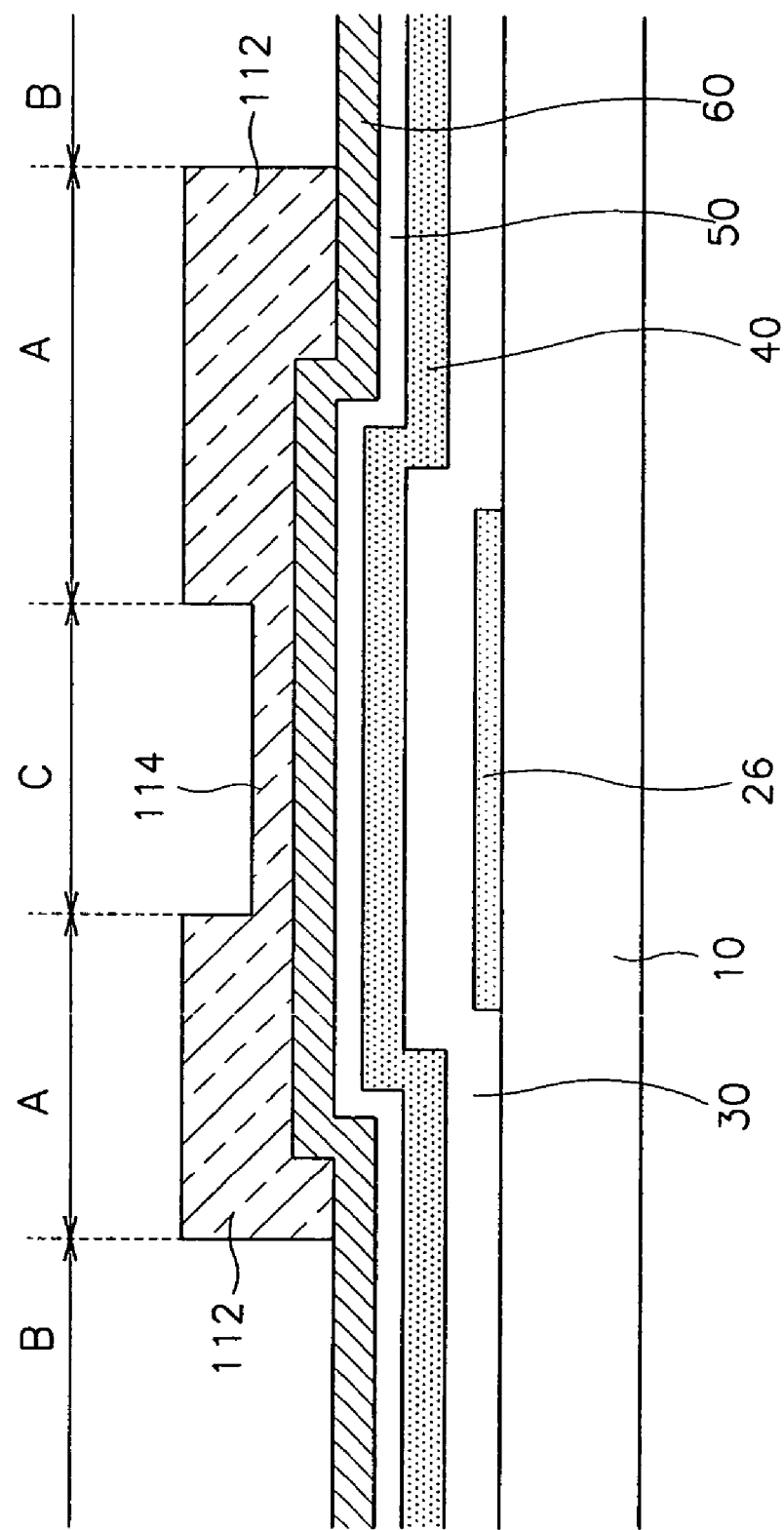

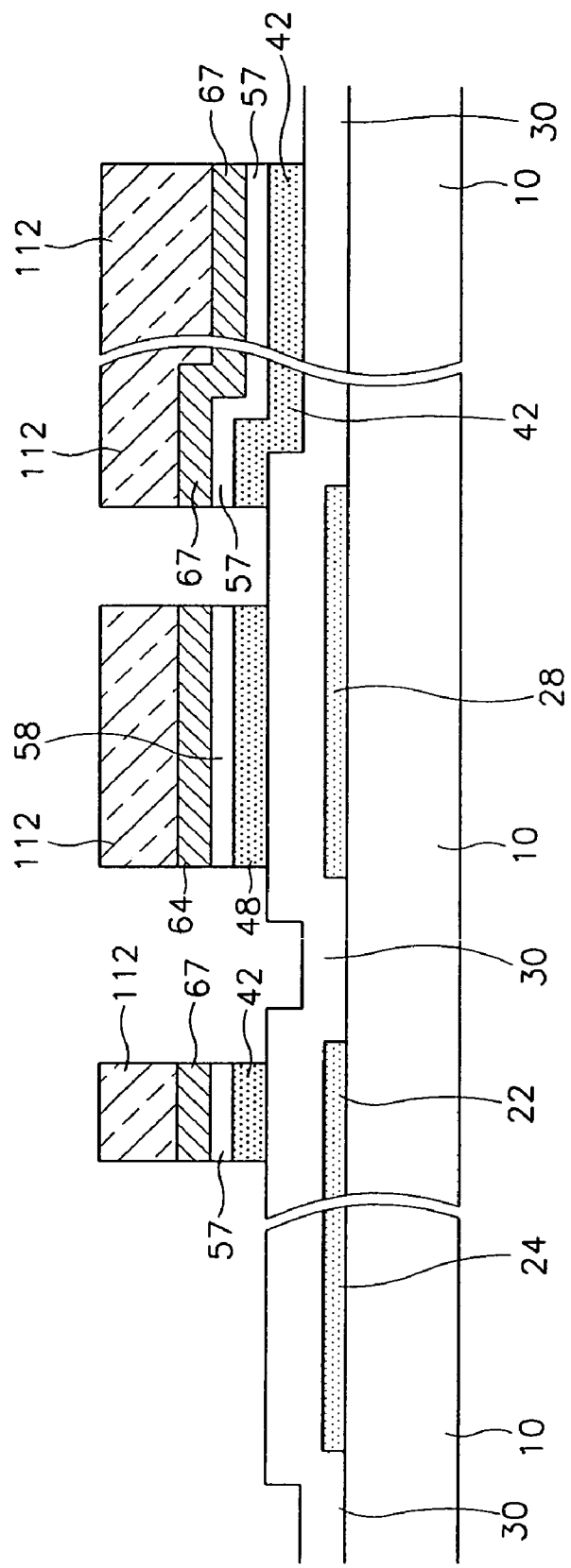

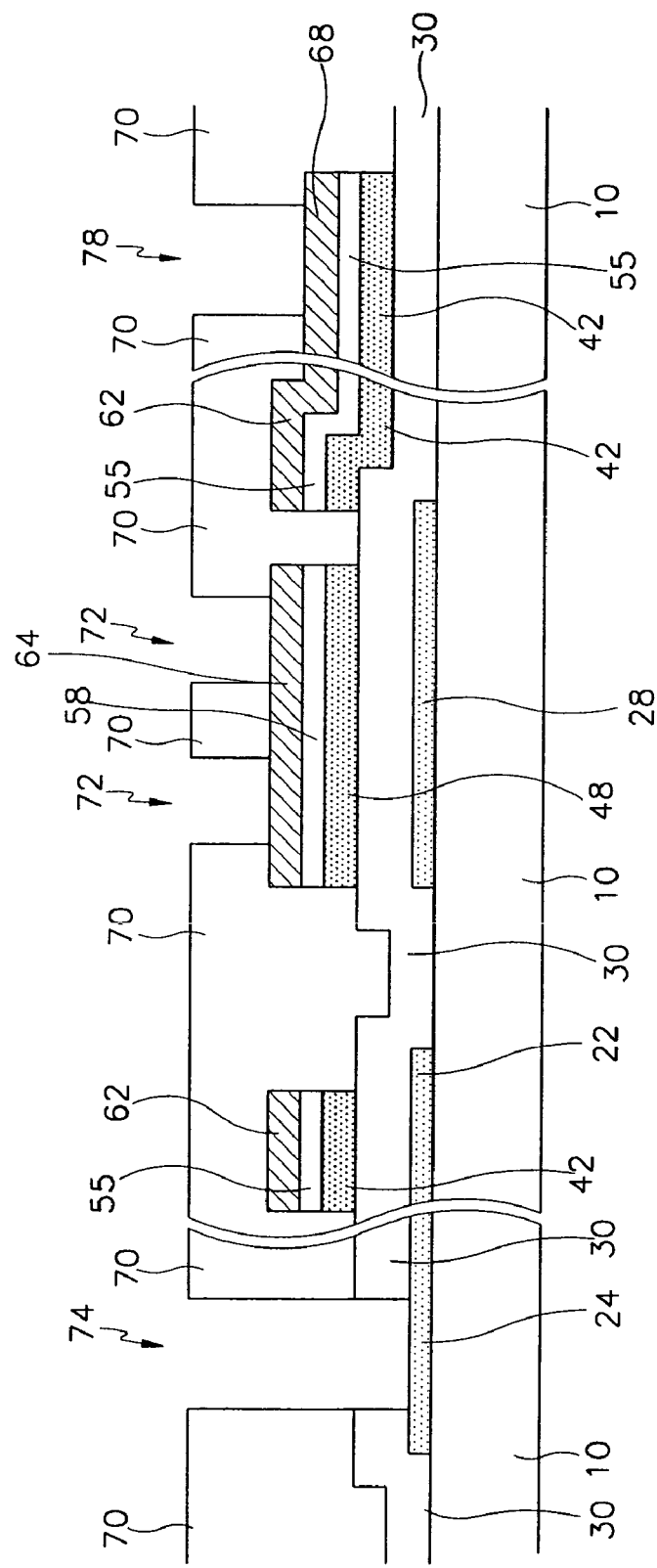

WIRING LINE ASSEMBLY AND METHOD FOR MANUFACTURING THE SAME, AND THIN FILM TRANSISTOR ARRAY SUBSTRATE HAVING THE WIRING LINE ASSEMBLY AND METHOD FOR MANUFACTURING THE SAME

CROSS REFERENCE TO PRIOR APPLICATION

This application is a Continuation Application from applicant's U.S. patent application Ser. No. 10/112,760 filed on Apr. 2, 2002, now U.S. Pat. No. 6,867,108, which claims priority to and the benefit of Korean Patent Application No. 2001-019874 filed on Apr. 13, 2001 which are all hereby incorporated by reference for all purposes as if fully set forth herein.

BACKGROUND OF THE INVENTION (a) Field of the Invention

The present invention relates to a wiring line assembly and method of manufacturing the same, and thin film transistor array substrate having the wiring line assembly and method of manufacturing the same.

(b) Description of the Related Art

Generally, wiring lines for a semiconductor device or a display device are used for signal transmission, and hence, it becomes important for such wiring lines to minimize signal delay.

For that purpose, it is required that the wiring lines should be formed with a conductive material having a low resistance. For instance, silver (Ag) may be used for such a conductive material. However the wiring lines of silver or silver alloy cannot easily adhere to the underlying substrate or thin film. Therefore, the wiring lines are liable to become detached from the substrate or thin film.

SUMMARY OF THE INVENTION

It is an object of the present invention to provide a thin film transistor array substrate which has a wiring line assembly having a low resistance and good adhesion characteristics.

This and other objects may be achieved by a thin film transistor array substrate having a wiring line assembly with the following features.

A glass substrate undergoes oxygen plasma treatment before the deposition of a silver or silver alloy-based layer. In case the substrate is formed with silicon, it may be subjected to a HF treatment, and may be amended after the deposition of the silver or silver alloy-based layer.

In a method of fabricating a wiring line assembly for a display device according to one aspect of the present invention, a glass substrate undergoes oxygen plasma treatment. A silver or silver alloy-based thin film is deposited onto the substrate, and patterned.

The silver alloy-based thin film may be deposited through sputtering. The silver alloy may be formed with a main content of silver (Ag) and an alloy content of conductive material of 0.01-20 atomic %. The alloy content has one or more conductive material components selected from Pd, Cu, Mg, Al, Li, Pu, Np, Ce, Eu, Pr, Ca, La, Nb, Nd, or Sm. The substrate with the silver alloy-based thin film may be further processed through annealing.

In a method of fabricating a wiring line assembly for a display device according to another aspect of the present invention, a silicon substrate undergoes HF treatment. A silver alloy-based thin film is deposited onto the silicon substrate, and patterned.

The deposition of the silver alloy-based thin film may be made through sputtering. The silver alloy may be formed with a main content of silver (Ag) and an alloy content of conductive material of 0.01-20 atomic %. The alloy content has one or more conductive material components selected from Mg, Ca, Th, Zr, Co, Ni, Ti, V, Nb, Mo, Ta, W, or Cr. The silicon substrate with the silver alloy-based thin film may be further processed through annealing. The annealing may be made at 250-500° C.

In a method of fabricating a thin film transistor array substrate according to still another aspect of the present invention, a substrate undergoes oxygen plasma treatment. A silver or silver alloy-based thin film is deposited onto the substrate, and patterned to form a gate line assembly. The gate line assembly includes gate lines, and gate electrodes. A gate insulating layer is deposited onto the substrate, and a non-doped amorphous silicon-based semiconductor layer is formed on the gate insulating layer. A data line assembly is formed on the semiconductor layer. The data line assembly includes data lines, source electrodes, and drain electrodes.

The deposition of the silver alloy-based thin film may be made through sputtering. The silver alloy may be formed with a main content of silver (Ag) and an alloy content of conductive material of 0.01-20 atomic %. The alloy content has one or more conductive material components selected from Pd, Cu, Mg, Al, Li, Pu, Np, Ce, Eu, Pr, Ca, La, Nb, Nd, or Sm. The silver alloy-based thin film may undergo an annealing treatment. The substrate may be formed with glass.

In a method of fabricating a thin film transistor array substrate according to still another aspect of the present invention, a conductive material-based layer is deposited onto a substrate, and patterned to thereby form a gate line assembly. The gate line assembly includes gate lines, and gate electrodes. A gate insulating layer is deposited onto the substrate, and a semiconductor layer is formed on the gate insulating layer. The semiconductor layer is HF-treated. A silver alloy-based thin film is deposited onto the semiconductor layer, and patterned to thereby form a data line assembly. The data line assembly includes data lines, source electrodes, and drain electrodes.

The silver alloy-based thin film may be annealed to reinforce adhesion between the thin film and the underlying semiconductor layer. In this case, the semiconductor layer may be HF-treated.

The silver alloy-based thin film may be deposited through sputtering. The silver alloy may be formed with a main content of silver (Ag) and an alloy content of conductive material of 0.01-20atomic %. The alloy content has one or more conductive material components selected from Mg, Ca, Th, Zr, Co, Ni, Ti, V, Nb, Mo, Ta, W, or Cr. The silicon substrate with the silver alloy-based thin film may also be annealed. The annealing temperature ranges between 250° C. and 500° C.

A protective layer may cover the semiconductor layer, and pixel electrodes may be connected to the drain electrodes. The pixel electrodes may be formed with a transparent conductive material.

The gate line assembly may further include gate pads connected to the gate lines, and the data line assembly may further include data pads connected to the data lines. Subsidiary gate pads and subsidiary data pads are connected to the gate and data pads and may be formed on the same plane as the pixel electrodes.

The semiconductor layer may be formed with a non-doped amorphous silicon-based under-layer and a doped amorphous silicon-based over-layer.

The data line assembly, the non-doped amorphous silicon-based layer, and the doped amorphous silicon-based layer may be simultaneously formed through photolithography.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components.

FIGS. 24B and 24C are cross sectional views of the thin film transistor array substrate taken along the XXIVb-XXIVb' line and the XXIVc-XXIVc' line of FIG. 24A, respectively.

FIGS. 25A and 25B illustrate the steps of fabricating the thin film transistor array substrate shown in FIG. 21 following those illustrated in FIGS. 24B and 24C, respectively.

FIGS. 26B and 26C are cross sectional views of the thin film transistor array substrate taken along the XXVIb-XXVIb' line and the XXVIc-XXVIc' line of FIG. 26A.

FIGS. 27A, 27B, 28A, 28B, 29A and 29B illustrate the steps of fabricating the thin film transistor array substrate shown in FIG. 21 following those illustrated in FIGS. 26B and 26C, respectively.

FIGS. 30B and 30C are cross sectional views of the thin film transistor array substrate taken along the XXXb-XXXb' line and the XXXc-XXXc' line of FIG. 30A.

DETAILED DESCRIPTION OF THE PREFERRED EMBODIMENTS

Preferred embodiments of this invention will be explained with reference to the accompanying drawings.

Figure 1:
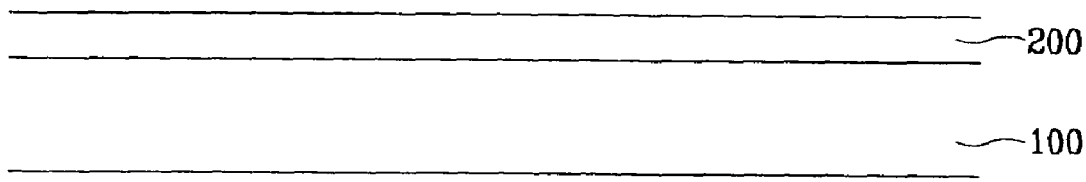
FIG. 1 is a cross sectional view of a thin film for a wiring line assembly deposited onto a glass substrate.

FIG. 1 is a cross sectional view of a thin film deposited onto a glass or silicon substrate.

In order to fabricate a wiring line assembly for a semiconductor device or a display device, as shown in FIG. 1, a thin film 200 based on a conductive material having a low resistance such as silver and silver alloy is deposited onto a substrate 100, and patterned through photolithography. In the case of a silver alloy-based thin film 200, it may be formed with a main content of silver (Ag), and an alloy content of conductive material of 0.01-20 atomic % or less. The alloy content may have one or two conductive material components selected from Pd, Cu, Mg, Al, Li, Pu, Np, Ce, Eu, Pr, Ca, La, Nb, Nd, or Sm. That is, a double or triple-sourced silver alloy may be used for the thin film 200.

As the silver or silver alloy-based thin film 200 adheres poorly to the underlying substrate 100, it is required that adhesion between the thin film 200 and the substrate 100 should be reinforced. For a semiconductor device or a thin film transistor array substrate for a liquid crystal display, such an adhesive force should reach 20 newton (N) or more.

For that purpose, the glass substrate may undergo an oxygen plasma treatment before depositing the silver or silver alloy-based conductive layer, or may be annealed after depositing the conductive layer. The preferable condition for the oxygen plasma treatment is under the pressure of 1-100 torr for 0.5-30 minutes while injecting oxygen gas by 1-1000 sccm. Preferably, the substrate is annealed at 250-500° C. for 30-120 minutes in a vacuum, nitrogen, or hydrogen atmosphere. The silicon substrate may undergo HF treatment before depositing the silver or silver alloy-based conductive layer, or annealing after depositing the conductive layer. In the HF treatment, the silicon substrate 100 is dipped into an HF solution. The HF solution is prepared through diluting an HF raw material with ultra-pure water by 1/50-1/2000. The period of time for the dipping is preferably in the range of 1-60 minutes (more preferably in the range of 5-10 minutes in case the dilution degree is 1/100). In case the alloy content is selected from refractory metals, a silicide layer may be formed between the thin film 200 and the substrate 100 during the annealing process. The annealing may be made at 250-500° C. for 30-120 minutes under a vacuum, hydrogen, or nitrogen atmosphere.

Figure 2A:
FIGS. 2A, 2B, 2C, 2D and 2E are photographs of silver-based thin films deposited onto glass substrates showing the adhesion between the thin films and the glass substrates.
Figure 2B:
Figure 2C:
Figure 2D:
Figure 2E:
Figure 3:
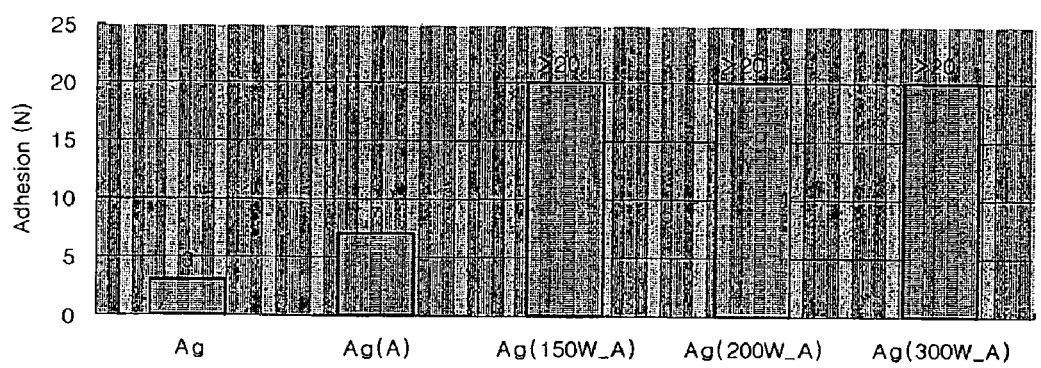
FIG. 3 is a graph illustrating adhesive force between the thin films and the glass substrates shown in FIGS. 2A through 2E.

FIGS. 2A, 2B, 2C, 2D and 2E are photographs of silver-based thin films formed on glass substrates taken after the silver-based thin film are scratched with a scratch tester, to show its adhesion states. FIG. 3 is a graph illustrating the adhesive force between the silver-based thin films and the glass substrates. Among the glass substrates shown in the drawings, those shown in FIGS. 2A and 2B are overlaid with the thin films without having the oxygen plasma treatment, and the thin films are scratched with a scratch tester. The glass substrates shown in FIGS. 2C, 2D and 2E are processed through oxygen plasma treatment at 150 W, 200 W and 300 W, and the thin films formed on the substrates are scratched with a scratch tester. The glass substrates shown in FIG. 2B are overlaid with the thin films without having the oxygen plasma treatment, and processed through annealing at 300° C. for 30 minutes.

The thickness of the silver-based thin films is about 1 μm. The annealing is made under the pressure of 2×10⁶ Torr. The oxygen plasma treatment is made under the pressure of 100 mTorr while injecting oxygen gas at a flow rate of 13 sccm. A scratch tester with a diamond tip is used to measure the adhesive force. The thin films are scratched for the measurements while gradually increasing the force applied to the tip of the scratch tester in the range of 0-20 N. The photographs are taken at six regions. The lines presented in the photographs are scratches of the tip of the scratch tester, and the application force becomes stronger from the left to the right.

As shown in FIGS. 2A and 3, a silver-based thin film 200 is deposited onto the glass substrate 100 without having the oxygen plasma treatment and the adhesion force is measured. It turns out that the thin film 200 is peeled off from the substrate 100 when the force of 3 N is applied to the tip of the scratch tester.

FIGS. 2B and 3 shows a silver-based thin film that is deposited onto a glass substrate 100 without oxygen plasma treatment, and is then annealed at 300° C. It turns out that the adhesive force is slightly increased, but the thin film 200 is detached from the substrate 100 at 7 N.

FIGS. 2C, 2D, 2E and 3 show a glass substrates 100 that underwent oxygen plasma treatment at 150 W, 200 W or 300 W respectively. A silver-based thin film 200 is peeled off onto the substrate 100, annealed and the adhesive force is measured. The thin film 200 adhered to the substrate 100 even until the scratch tester force reaches 20 N or more. It shows that oxygen plasma treatment of the substrate 100 increased the adhesive force between the substrate 100 and the thin film 200.

FIGS. 4A, 4B, 4C, 4D and 4E are photographs that show double-sourced silver alloy-based thin films formed on glass substrates scratched with a scratch tester, and the adhesion states. FIG. 5 is a graph illustrating the adhesive forces between the silver alloy-based thin films and the glass substrates.

The processing conditions of FIGS. 4A, 4B, 4C, 4D and 4E are the same as those of FIGS. 2A, 2B, 2C, 2D and 2E except that double-sourced silver alloy has a main content of Ag and an alloy content of Mg of 5 atomic % and that the thin film is sputtered.

Figure 4A:
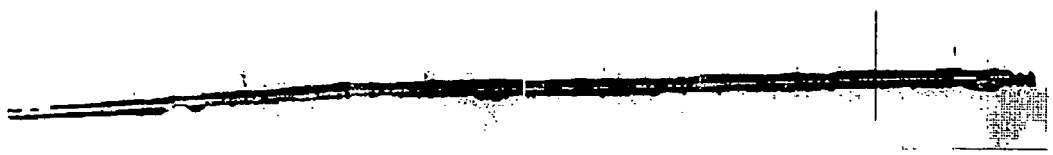
FIGS. 4A, 4B, 4C, 4D and 4E are photographs of double-sourced silver alloy-based thin films deposited onto glass substrates showing the adhesion between the thin films and the glass substrates.
Figure 4B:
Figure 5:
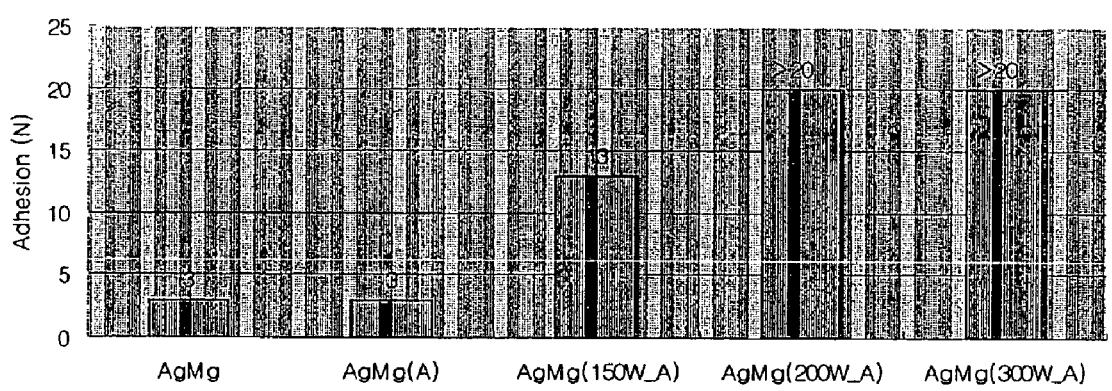
FIG. 5 is a graph illustrating adhesive force between the thin films and the glass substrates shown in FIGS. 4A through 4E.

As shown in FIGS. 4A, 4B and 5, a glass substrate 100 is overlaid with a AgMg-based thin film 200 without having the oxygen plasma treatment. When the force applied to the tip of the scratch tester is about 3 N, the thin film 200 is peeled off from the substrate 100. This shows poor adhesion between the substrate 100 and the thin film 200.

Figure 4C:
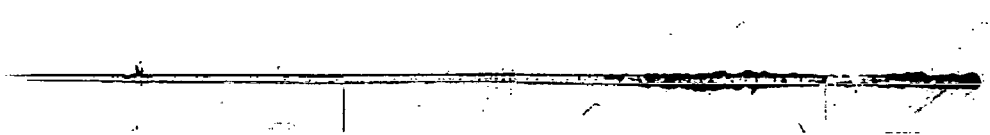

FIGS. 4C and 5 show a glass substrate 100 processed through oxygen plasma treatment at 150 W overlaid with a silver alloy-based thin film 200, and annealed at 300° C. It turns out that the adhesive force is increased to 13 N.

Figure 4D:
Figure 4E:

FIGS. 4D, 4E and 5 show a glass substrate 100 processed through oxygen plasma treatment at 200 W or 300 W overlaid with a silver alloy-based thin films 200, and annealed. The thin film 200 is not peeled off from the substrate 100 even when the scratch tester force reaches 20 N or more. That is, the adhesive force between the substrate 100 and the thin film 200 is greatly increased.

FIGS. 6A, 6B, 6C, 6D and 6E are photographs that show triple-sourced silver alloy-based thin films formed on glass substrates scratched with a scratch tester, and the adhesion stakes. FIG. 7 is a graph illustrating adhesive force between the thin films and the glass substrates.

The processing conditions related to FIGS. 6A, 6B, 6C, 6D and 6E are the same as those related to FIGS. 2A, 2B, 2C, 2D and 2E except that triple-sourced silver alloy has a main content of Ag and an alloy content of Pd and Cu of 5 atomic %, and that the thin film is sputtered.

Figure 6A:
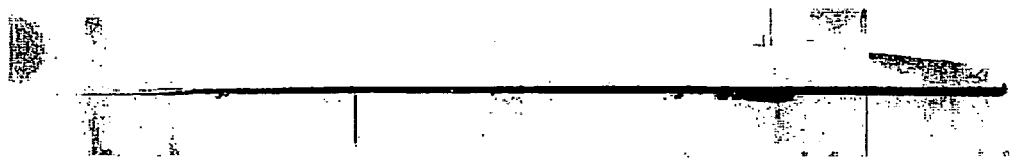
FIGS. 6A, 6B, 6C, 6D and 6E are photographs of triple-sourced silver alloy-based thin films deposited onto glass substrates showing the adhesion between the thin films and the glass substrates.
Figure 6B:
Figure 6C:
Figure 6D:
Figure 6E:
Figure 7:
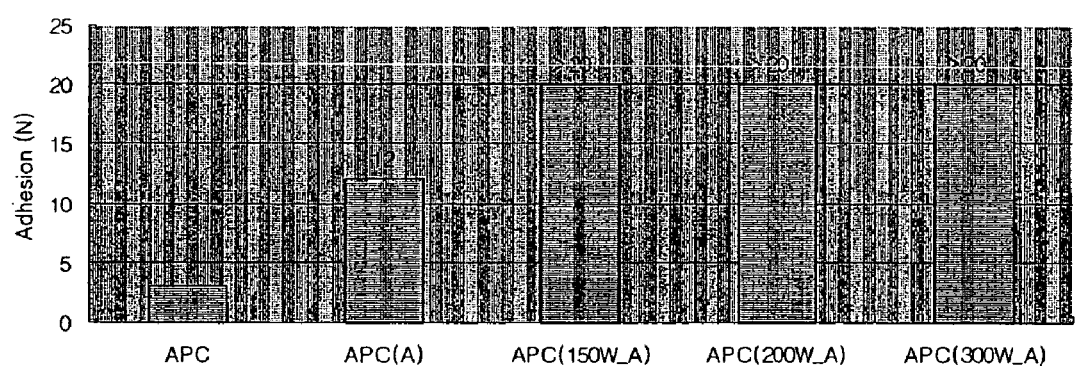
FIG. 7 is a graph illustrating adhesive force between the thin films and the glass substrates shown in FIGS. 6A through 6E.

As shown in FIGS. 6A, 6B and 7, a glass substrate 100 is overlaid with an AgPdCu-based thin film 200 without undergoing the oxygen plasma treatment. When the force applied to the tip of the scratch tester is about 3 N, the thin film 200 is detached from the substrate 100. This shows very poor adhesion between the substrate 100 and the thin film 200.

FIGS. 6C, 6D and 6E and 7 show a glass substrate 100 processed through oxygen plasma treatment at 150 W, 200 W, or 300 W overlaid with a silver alloy-based thin film 200, and annealed. The thin film 200 is not detached from the substrate 100 even when the force applied to the tip of the scratch tester reaches 20 N or more. That is, the adhesive force between the substrate 100 and the thin film 200 increases very much through the oxygen plasma treatment.

Figure 8A:
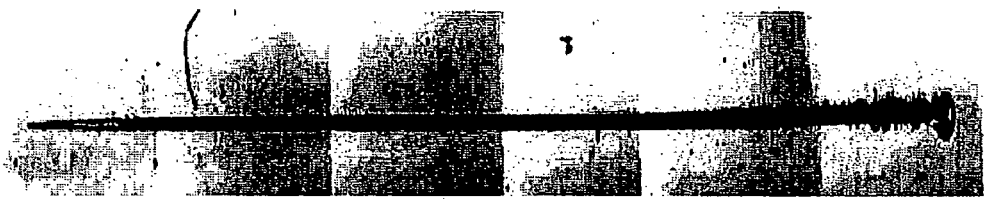
FIGS. 8A, 8B, 8C and 8D are photographs of AgMg-based thin films deposited onto glass substrates showing the adhesion between the thin films and the glass substrates.
Figure 8B:
Figure 8C:
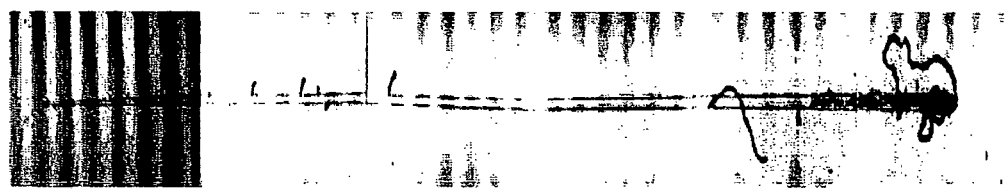
Figure 8D:
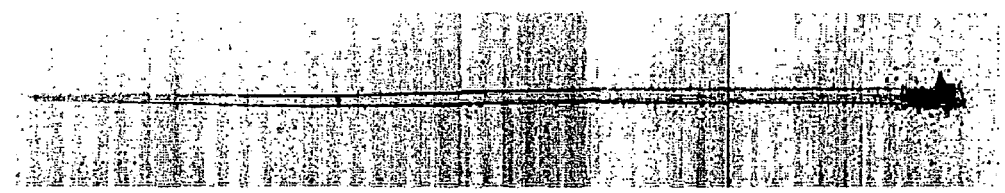
Figure 9:
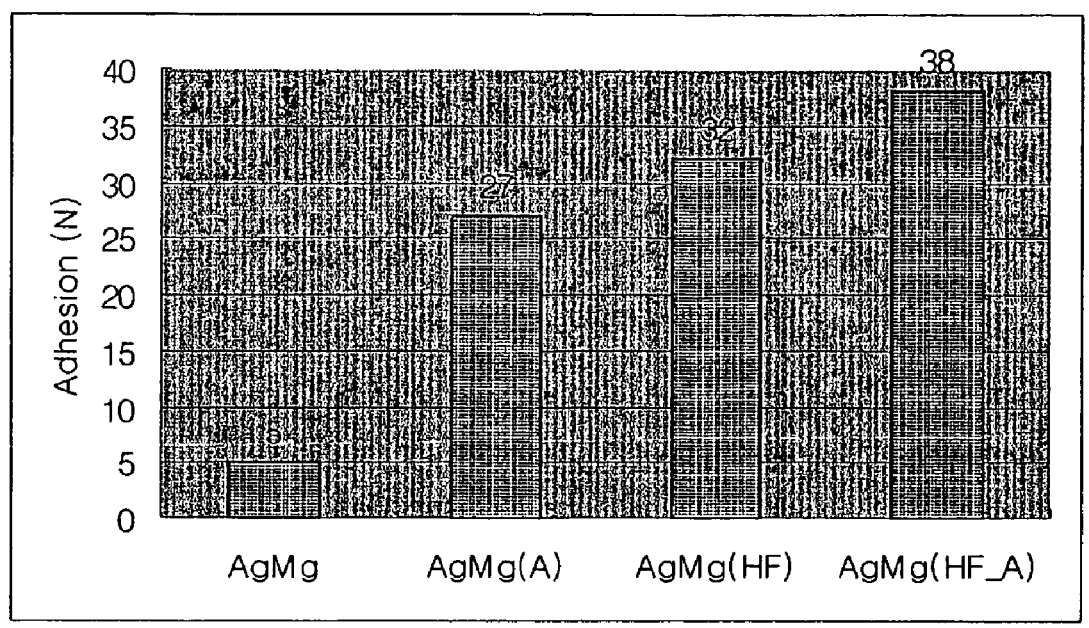
FIG. 9 is a graph illustrating adhesive force between the thin films and the glass substrates shown in FIGS. 8A through 8D.

FIGS. 8A, 8B, 8C and 8D are photographs that show AgMg-based thin films formed on mono-crystalline silicon substrates scratched with a scratch tester, and their adhesion states. FIG. 9 is a graph illustrating adhesive forces between the silver alloy-based thin films and the silicon substrates. FIGS. 8A and 8B show the silicon substrates that are overlaid with the thin films without having the HF treatment, and the thin films are scratched with a scratch tester. The silicon substrate shown in FIG. 8A is annealed, and the silicon substrate shown in FIG. 8B is not annealed. The silicon substrates shown in FIGS. 8C and 8D undergo the HF treatment, and are overlaid with the thin films. The silicon substrate shown in FIG. 8C is not annealed, while that shown in FIG. 8D is annealed. The symbols "A" and "HF" each refer to the annealing process and the HF treatment respectively, while the symbol "HF-A" refers to both of the annealing process and the HF treatment.

The silver alloy is formed with a target material having a main content of Ag, and an alloy content of Mg of 5 atomic %. The target material is sputtered onto the substrate under the pressure of 2m Torr while injecting argon gas under the pressure of $2 \times 10^6$ Torr. The substrate is annealed at 300-500° C. for 30 minutes under the pressure of $2 \times 10^6$ Torr. A scratch tester with a diamond tip is used to measure the adhesive force. The thin films are scratched for the measurements while gradually increasing the force applied to the tip of the scratch tester in the range of 0-40 N. The photographs are taken at six regions. The lines presented in the photographs are scratches of the tip of the scratch tester, and the application force becomes stronger from the left to the right.

FIGS. 8A and 9 show an AgMg-based thin film 200 deposited onto a silicon substrate 100 without making the HF treatment. In this state, the adhesive force is measured. The thin film 200 is peeled off from the substrate 100 when the scratch tester applied force of 5 N.

As shown in FIGS. 8B, 8C, 8D and 9, a silicon substrate 100 undergoes HF treatment, and a silver alloy-based thin film 200 is deposited onto the silicon substrate 100. The silicon substrate 100 overlaid with the thin film 200 is annealed at 300° C. for 30 minutes. It turns out that the adhesive force between the substrate 100 and the thin film 200 is increased by 27 N, 32 N and 38 N.

FIGS. 10A, 10B, 10C and 10D are photographs showing AgTi-based thin films formed on glass substrates scratched with a scratch tester and the adhesion states thereof. FIG. 11 is a graph illustrating adhesive force between the thin films and the glass substrates.

The processing conditions related to FIGS. 10A, 10B, 10C and 10D are the same as those related to FIGS. 8A, 8B, 8C and 8D except that a target material having a main content of Ag and an alloy content of Ti at 5 atomic % is used for the thin films, and the thin film is deposited through sputtering.

Figure 10A:
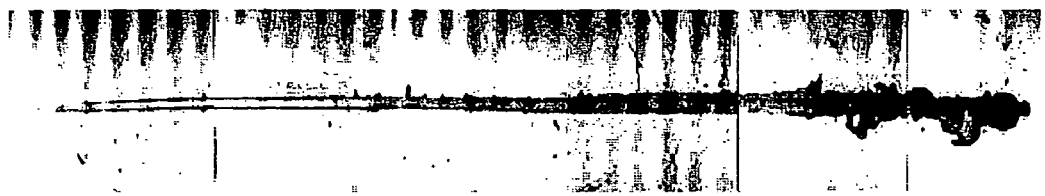
FIGS. 10A, 10B, 10C and 10D are photographs of AgTi-based thin films deposited onto glass substrates showing the adhesion between the thin films and the glass substrates.
Figure 10B:
Figure 10C:
Figure 10D:
Figure 11:
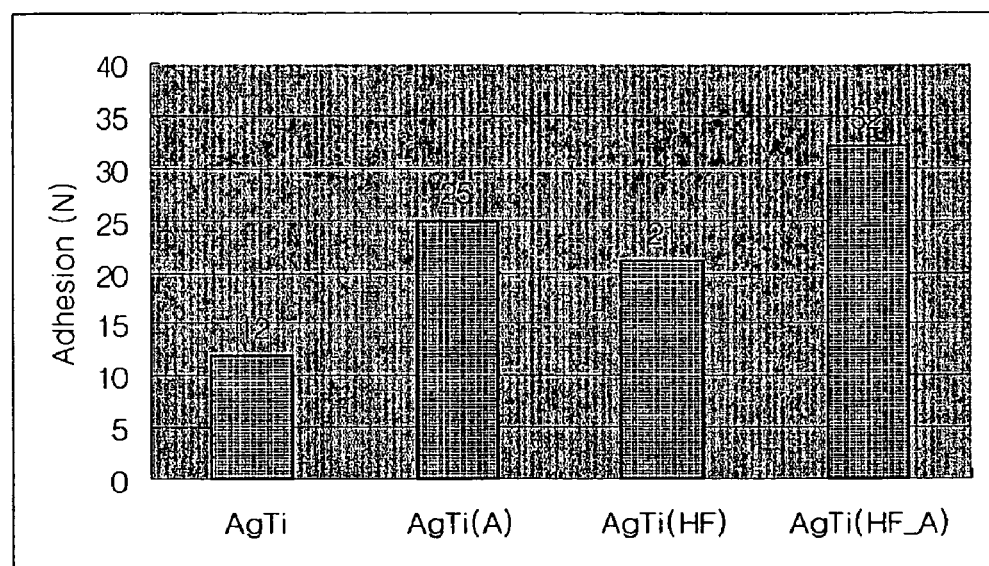
FIG. 11 is a graph illustrating adhesive force between the thin films and the glass substrates shown in FIGS. 10A through 10D.

As shown in FIGS. 10A and 11, a glass substrate 100 is overlaid with an AgTi-based thin film 200 without undergoing the HF treatment. When the force applied to the tip of the scratch tester is about 12 N, the thin film 200 is detached from the substrate 100. This shows that the adhesive strength between the substrate 100 and the thin film 200 is seriously weak.

FIGS. 10B, 10C, 10D and 11 show a glass substrate 100 processed through oxygen plasma treatment and overlaid with a silver alloy-based thin film 200, and annealed at 300° C. It turns out that the adhesive force between the substrate 100 and the thin film 200 is increased to 20 N or more.

Figure 12:
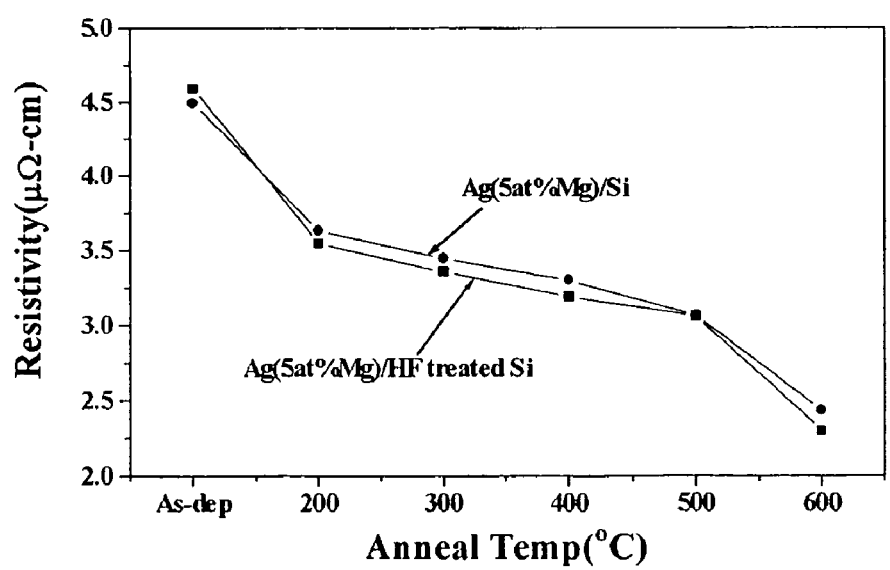
FIGS. 12 and 13 are graphs illustrating variations in resistivity pursuant to the annealing temperatures of an AgMg-based thin film and an AgTi-based thin film deposited onto an HF-treated substrate and a non-treated substrate.
Figure 13:
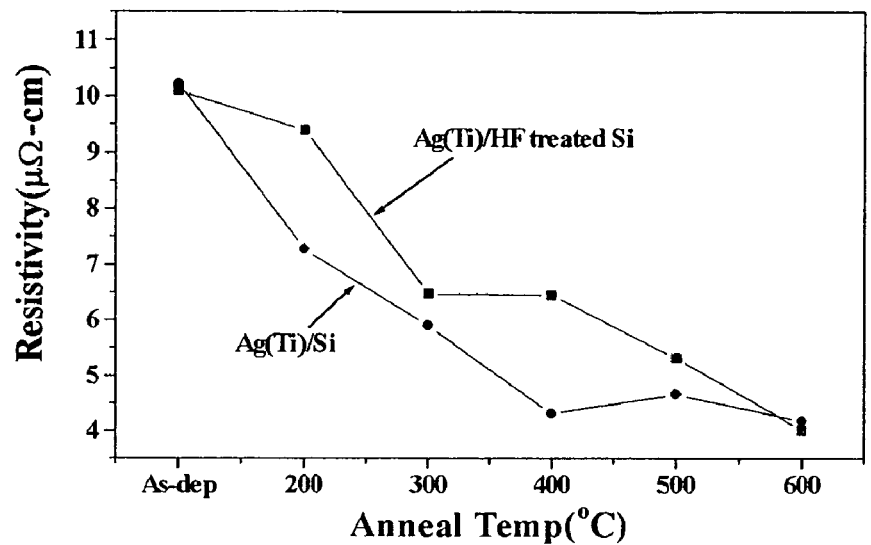

FIGS. 12 and 13 are graphs illustrating variations in resistivity depending upon the annealing temperatures of an AgMg-based thin film and an AgTi-based thin film deposited onto an HF-treated substrate and a non-treated substrate. The horizontal axis of each graph indicates the resistivity, and the vertical axis thereof indicates the annealing temperature. The symbol "As-dep" refers to the state in that the substrate overlaid with the silver alloy-based thin film is not annealed.

As shown in FIG. 12, the AgMg-based thin films deposited onto the HF-treated substrate and the non-treated substrate bear the resistivity of 4.5 μΩ-cm. As the annealing is made with respect thereto, the resistivity becomes decreased. It turns out that the resistivity is about 3.0-3.5 μΩ-cm in the annealing temperature range of 300-500° C.

As shown in FIG. 13, the AgTi-based thin films deposited onto the HF-treated substrate and the non-treated substrate bear the resistivity of 10 μΩ-cm. Annealing decreases the resistivity. It turns out that the resistivity is about 4.5 μΩ-cm in the annealing temperature range of 300-500° C.

When annealing, a silicide layer may be formed between the silver alloy (AgMg, AgTi)-based thin films 200 and the silicon substrates 100. The silicide layer may serve to strengthen the adhesion between the thin film 200 and the silicon substrate 100.

Figure 14:
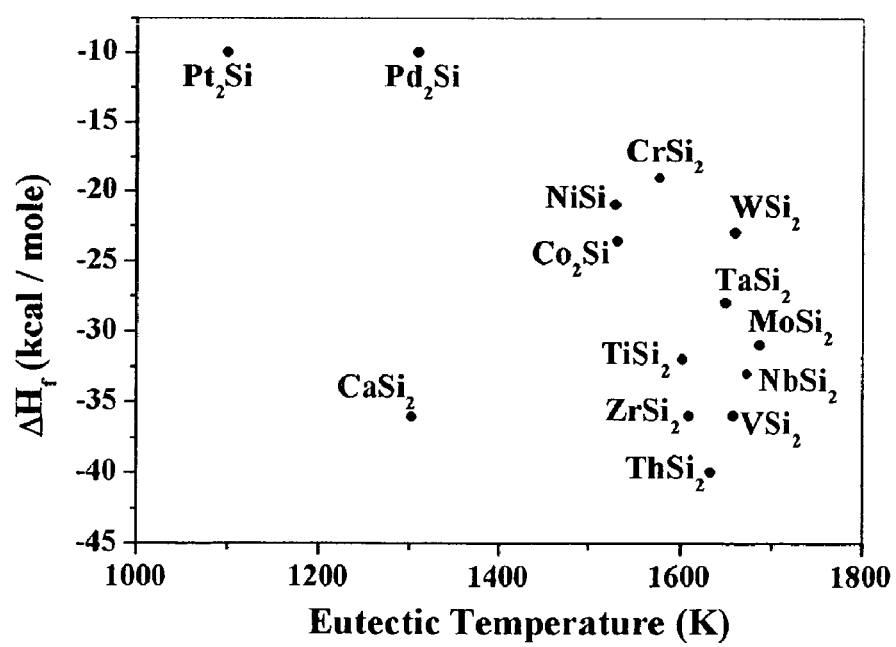
FIG. 14 is a graph illustrating the eutectic temperature of a silicon-based alloy and an enthalpy depending upon the eutectic temperature.

FIG. 14 illustrates the eutectic temperature (K) of silicon-based alloy, and the enthalpy ($\Delta H_f$, kcal/mole) depending upon the eutectic temperature. It can be known from the drawing that the silver alloy for the thin film 200 reacts with the silicon for the substrate 100, thereby forming a silicide layer.

The above-described techniques that strengthen the adhesion between the thin film and the underlying substrate by oxygen plasma or HF treatment, or annealing can also be applied to the substrate that is formed of materials other than glass or silcon.

The structure of a thin film transistor array substrate according to a first preferred embodiment of the present invention will be now explained with reference to FIGS. 15 and 16.

Figure 15:
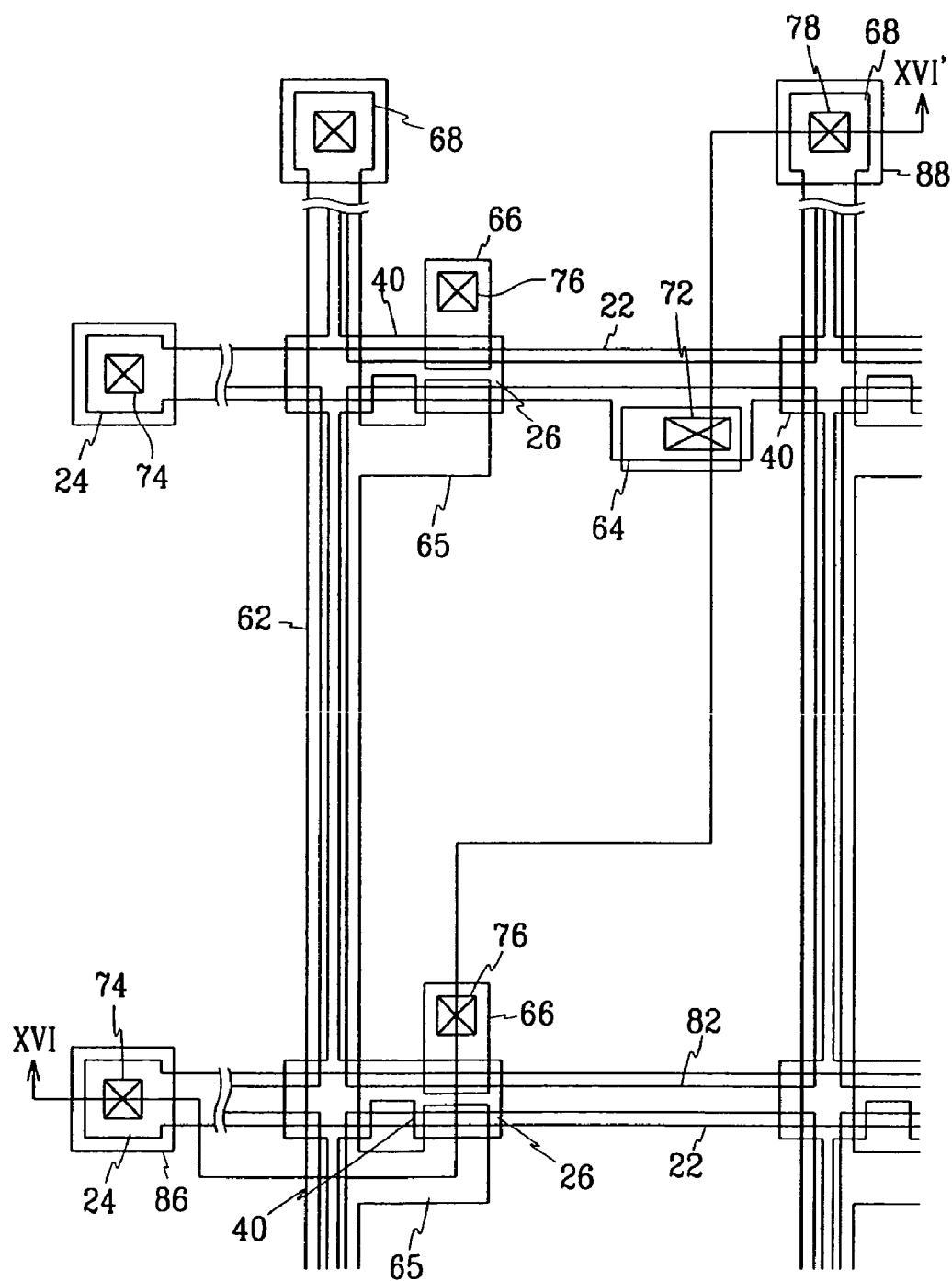
FIG. 15 is a plan view of a thin film transistor array substrate for a liquid crystal display according to a first preferred embodiment of the present invention.
Figure 16:
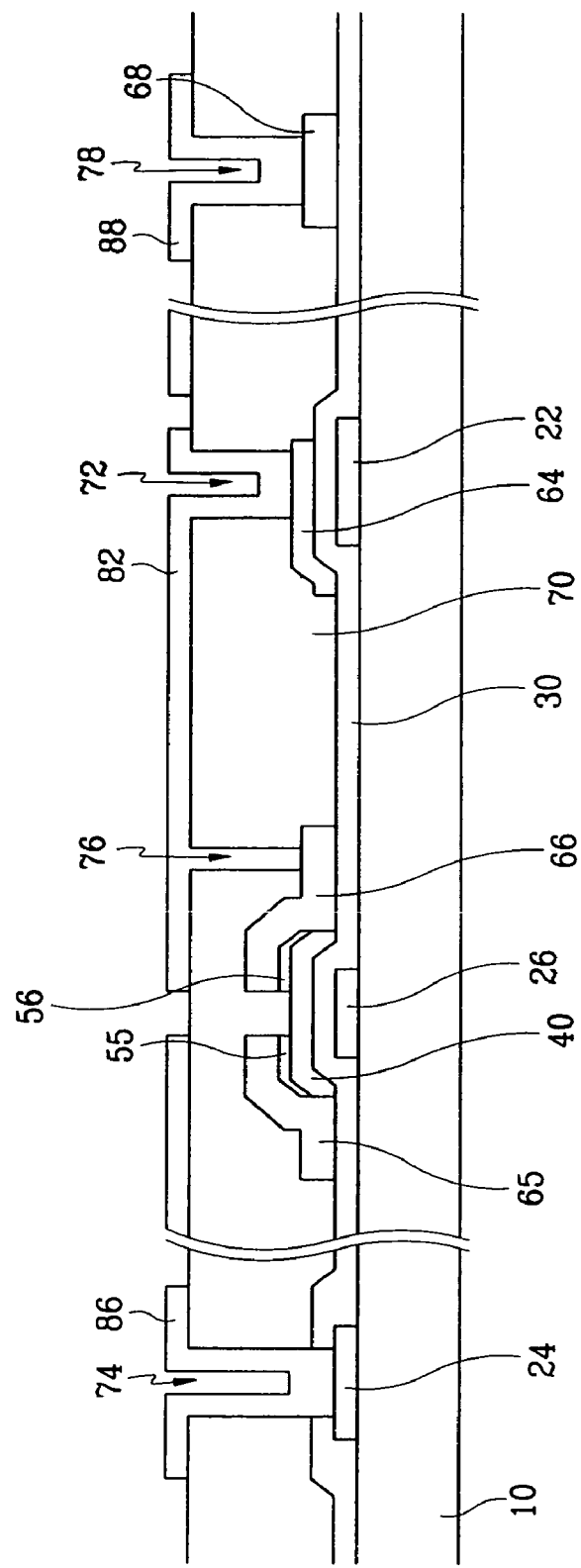
FIG. 16 is a cross sectional view of thin film transistor array substrate taken along the XVI-XVI' line of FIG. 15.

FIG. 15 is a plan view of a thin film transistor array substrate according to a first preferred embodiment of the present invention, and FIG. 16 is a cross sectional view taken along the XVI-XVI' line of FIG. 15.

A gate line assembly is formed on an insulating substrate 10 with a single or multiple-layered structure where silver, or double/triple-sourced silver alloy is present. The gate line assembly has an adhesive force of 20 N or more with respect to the substrate 10. The gate line assembly includes gate lines 22 proceeding in the horizontal direction, and gate pads 24 connected to ends of the gate lines 22. The gate pads 24 receive gate signals from the outside, and transmit them to the gate lines 22. Gate electrodes 26 for TFTs are connected to the gate lines 22. In case the gate line assembly is formed with a multiple-layered structure, it may contain a pad material bearing good contact characteristic with other materials. In case the pad material is a double or triple-sourced silver alloy, it is formed with a main content of silver, and an alloy content of conductive material bearing 0.01-20 atomic % or less such as Pd, Cu, Mg, Al, Li, Pu, Np, Ce, Eu, Pr, Ca, La, Nb, Nd, and Sm.

A gate insulating layer 30 is formed on the substrate 10 with silicon nitride such that it covers the gate line assembly.

A semiconductor pattern 40 is formed on the gate insulating layer 30 over the gate electrodes 24, and ohmic contact patterns 55 and 56 are formed on the semiconductor pattern 40 with silicide or n+ hydrogenated amorphous silicon where n type impurities are doped at high concentration.

A data line assembly is formed on the ohmic contact patterns 55 and 56 and the gate insulating layer 30 with silver alloy. The data line assembly may bear a single or multiple-layered structure. The data line assembly includes data lines 62 proceeding in the vertical direction while crossing over the gate lines 22 to define pixels, and source electrodes 65 branched from the data lines 62 while extending over the one-sided ohmic contact pattern 55. Data pads 68 are connected to one-sided ends of the data lines 62 to receive picture signals from the outside. Drain electrodes 66 are placed on the other-sided ohmic contact pattern 56 while being separated from the source electrodes 65 around the gate electrodes 26. In order to enhance storage capacity, the data line assembly may further include storage capacitor conductive patterns 64. The storage capacitor conductive patterns 64 are overlapped with the gate lines 22 to thereby form storage capacitors.

A double or triple-sourced silver alloy may be used for the data line assembly. The silver alloy is formed with a main content of silver, and an alloy content of conductive material of 0.01-20 atomic % or less such as Mg, Ca, Th, Zr, Co, Ni, Ti, V, Nb, Mo, Ta, W, and Cr. In case the data line assembly has a multiple-layered structure, it may be formed with a conductive material bearing a good contact characteristic with other materials.

A protective layer 70 is formed on the data line assembly and the semiconductor pattern 40 exposed through the data line assembly with silicon nitride or an organic material bearing a good planarization characteristic.

The protective layer 70 is provided with contact holes 72, 76 and 78 exposing the storage capacitor conductive patterns 64, the drain electrodes 66 and the data pads 68, respectively. Furthermore, the protective layer 70 has contact holes 74 exposing the gate pads 24 together with the gate insulating layer 30.

Pixel electrodes 82 are formed on the protective layer 70 at the pixel regions such that they are connected to the storage capacitor conductive patterns 64 and the drain electrodes 66 through the contact holes 72 and 76. Furthermore, subsidiary gate pad 86 and subsidiary data pad 88 are formed on the protective layer 70 such that they are connected to the gate and data pads 24 and 68 through the contact holes 74 and 78. The pixel electrodes 82, and the subsidiary gate pad 86 and subsidiary data pad 88 are formed of a transparent conductive material such as indium tin oxide (ITO) or indium zinc oxide (IZO).

The storage capacitor conductive patterns 64 connected to the pixel electrodes 82 are overlapped with the gate lines 22 to thereby form storage capacitors. In case the storage capacity is insufficient, storage capacitor line assembly may be formed at the same plane as the gate line assembly.

The above-structured thin film transistor array substrate equipped with a wiring line assembly based on silver or silver alloy bearing a low resistance minimizes signal delays, even when formed in a wide screen and high resolution format.

A method of fabricating the thin film transistor array substrate will be now explained with reference to FIGS. 17A, 17B, 18A, 18B, 19A, 19B, 20A and 20B.

Figure 17A:
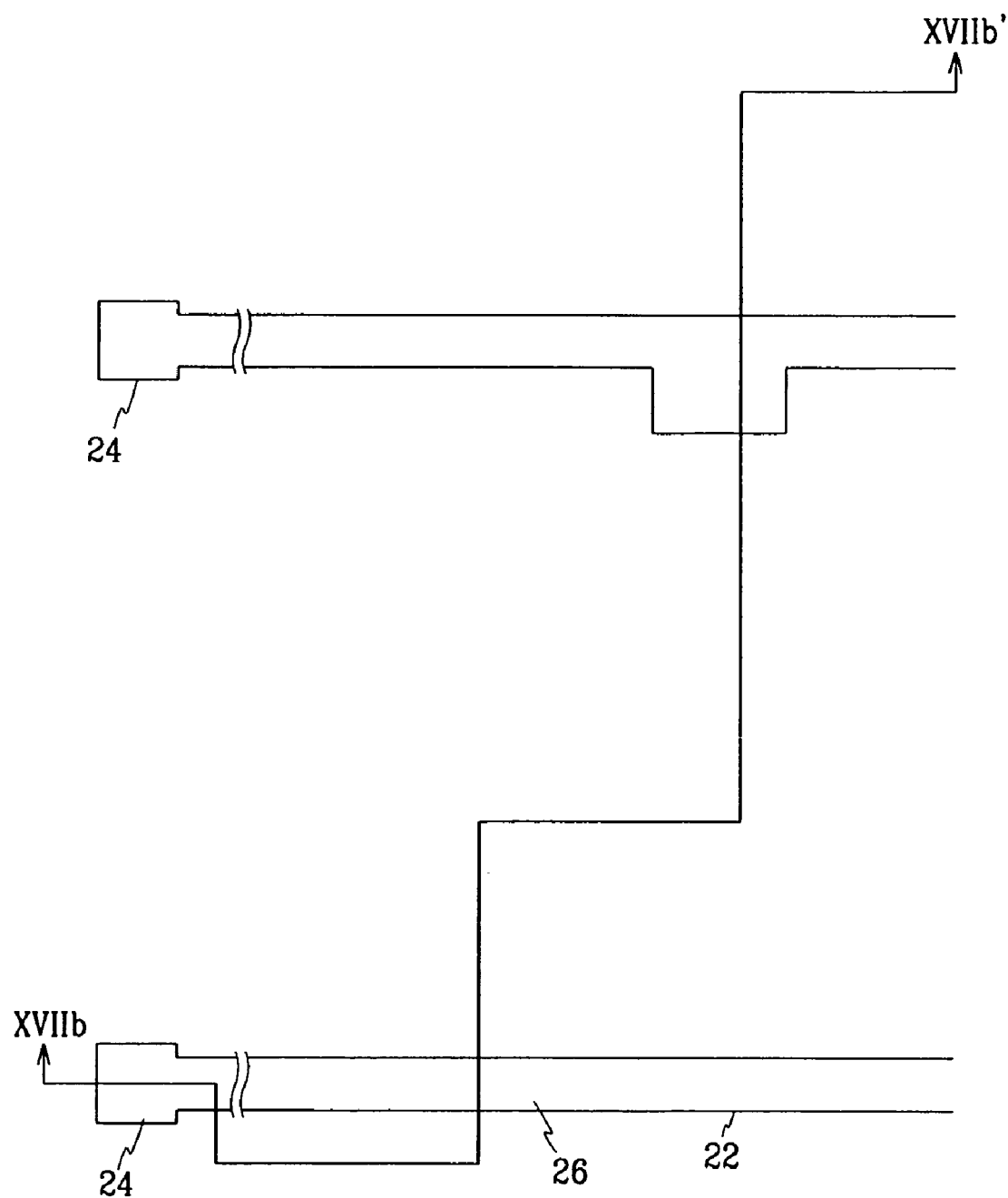
FIGS. 17A, 18A, 19A and 20A sequentially illustrate the steps of fabricating the thin film transistor array substrate shown in FIG. 15.
Figure 17B:
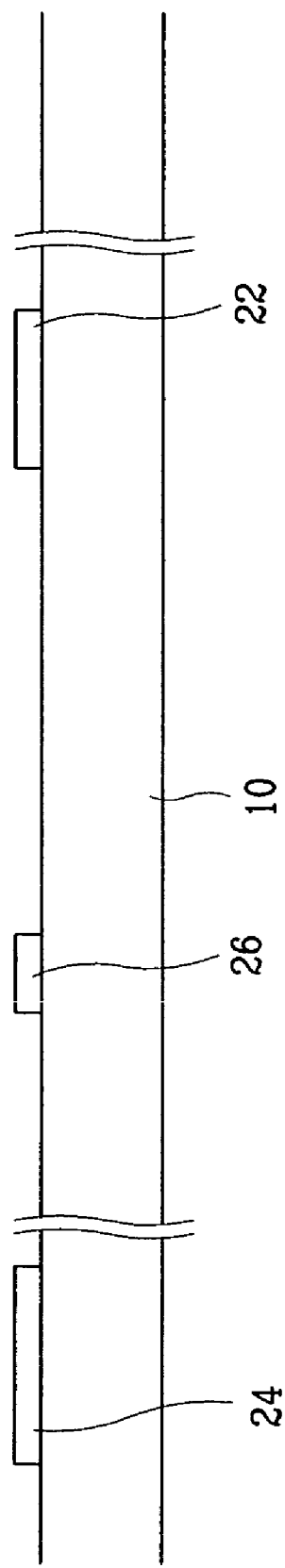
FIG. 17B is a cross sectional view of the thin film transistor array substrate taken along the XVIIb-XVIIb' line of FIG. 17A.

As shown in FIGS. 17A and 17B, a glass substrate 10 undergoes oxygen plasma treatment for ten minutes. A silver or silver alloy-based layer is deposited onto the glass substrate 10, and patterned to thereby form a gate line assembly. The gate line assembly includes gate lines 22, gate electrodes 26, and gate pads 24. In case a double or triple-sourced silver alloy is used for the gate line assembly, it may be formed of a main content of silver, and an alloy content of conductive material of 0.01-20 atomic % such as Pd, Cu, Mg, Al, Li, Pu, Np, Ce, Eu, Pr, Ca, La, Nb, Nd, and Sm. The silver alloy is sputtered onto the substrate 10, and patterned to thereby form the gate line assembly.

The glass substrate 10 is oxygen-plasma treated to strengthen the adhesion between the substrate and the silver alloy-based layer by 20 N or more. After depositing the silver alloy-based layer, the deposited layer may be annealed.

The oxygen plasma treatment should be preferably performed under the pressure of 1-100 torr for 0.5-30 minutes while injecting oxygen gas by 1-1000 sccm. The annealing should be preferably made at 250-500° C. for 30-120 minutes under a vacuum, nitrogen, or hydrogen atmosphere.

Figure 18A:
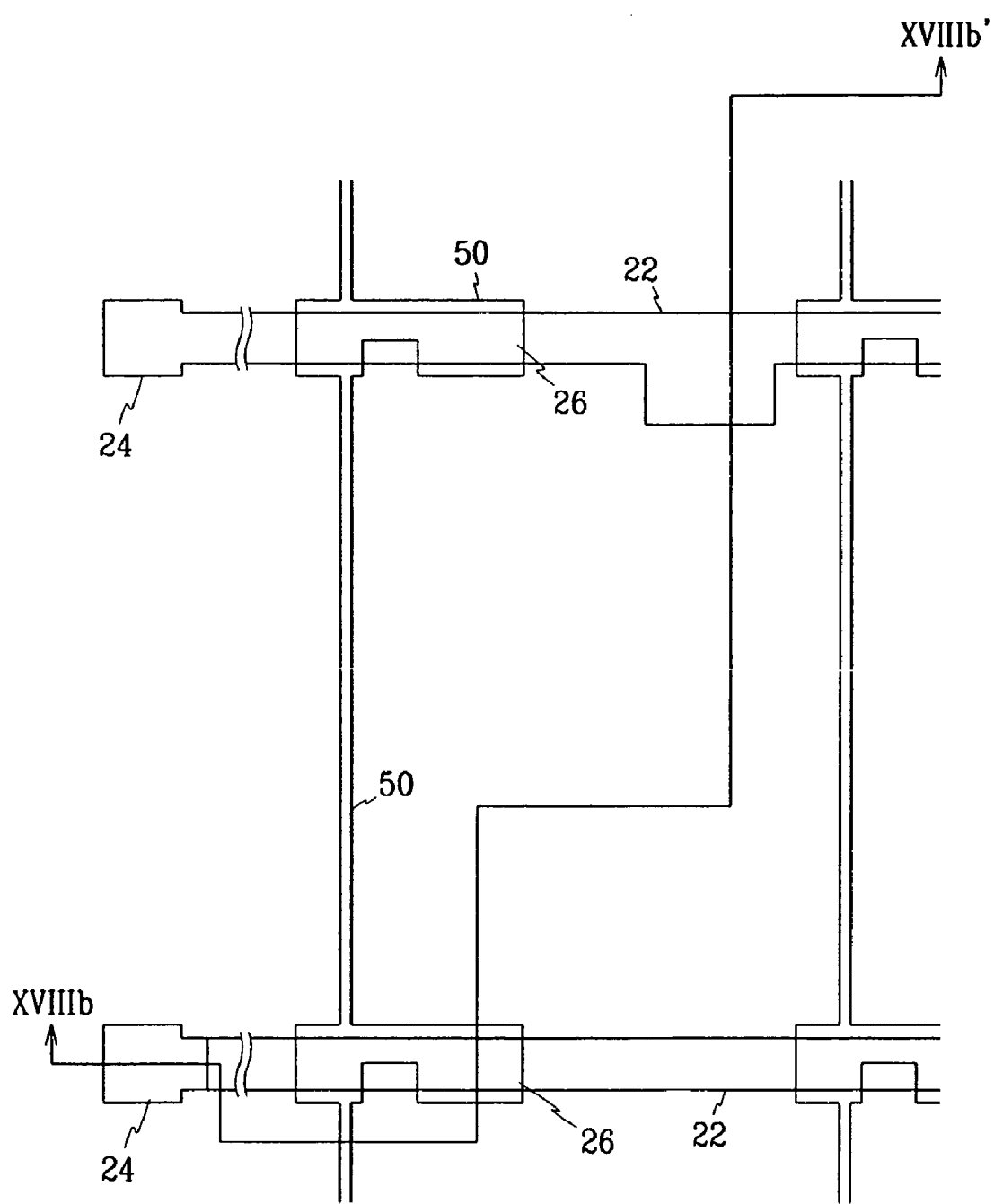
Figure 18B:
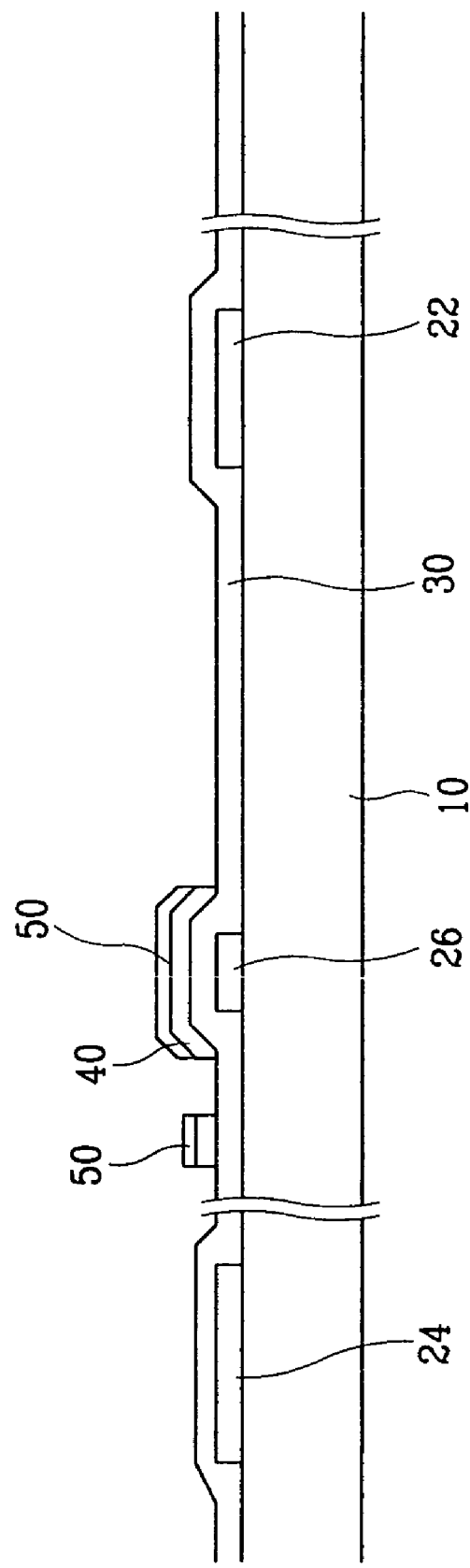
FIG. 18B is a cross sectional view of the thin film transistor array substrate taken along the XVIIIb-XVIIIb' line of FIG. 18A.

Thereafter, as shown in FIGS. 18A and 18B, a silicon nitride-based gate insulating layer 30, an amorphous silicon-based layer 40, a doped amorphous silicon-based layer 50 are sequentially deposited onto the substrate 10. The amorphous silicon-based layer 40, and the doped amorphous silicon-based layer 50 are patterned through a mask to thereby form a semiconductor pattern 40 and an ohmic contact pattern 50. The semiconductor pattern 40 and the ohmic contact pattern 50 are placed on the gate insulating layer 30 over the gate electrodes 24.

Figure 19A:
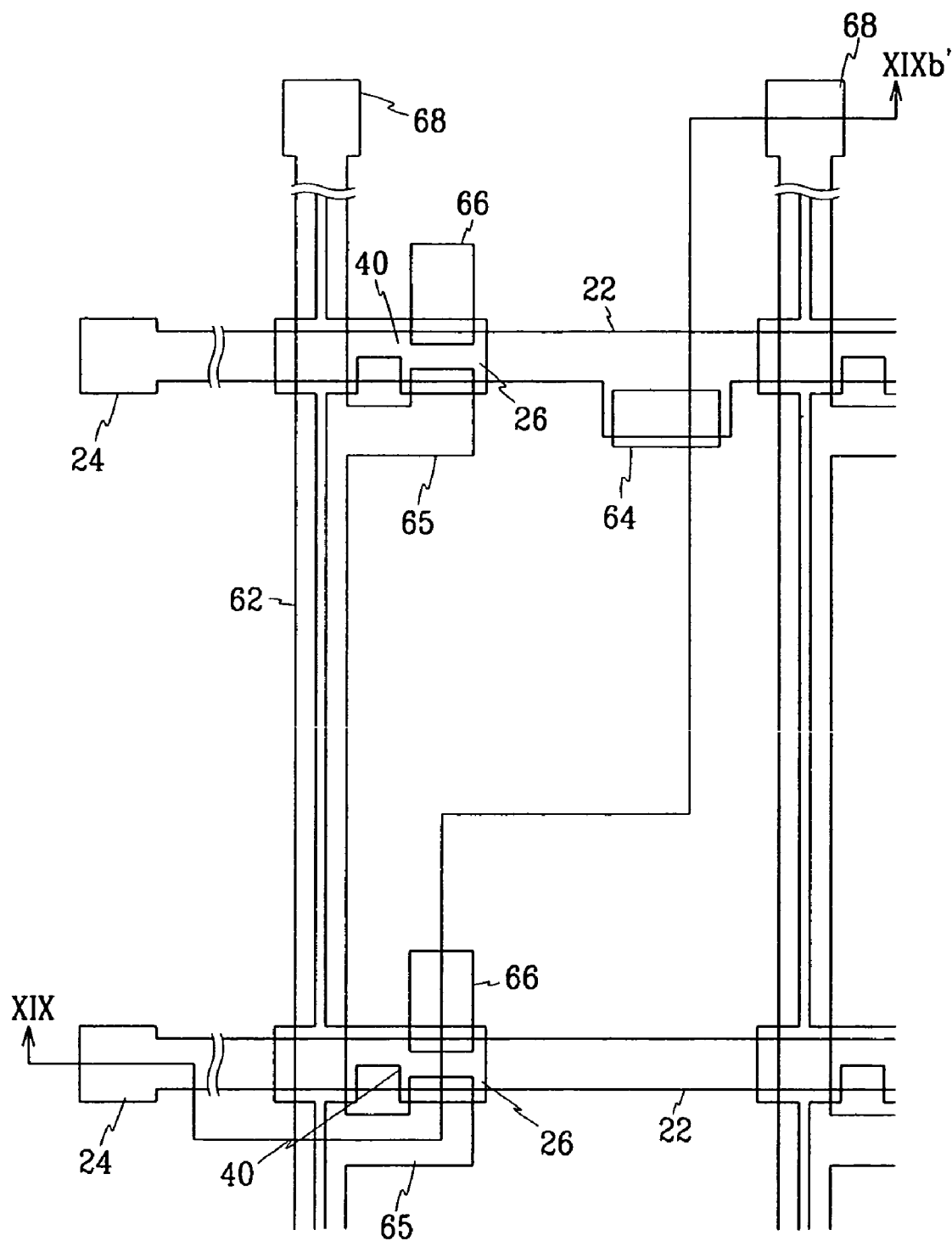
Figure 19B:
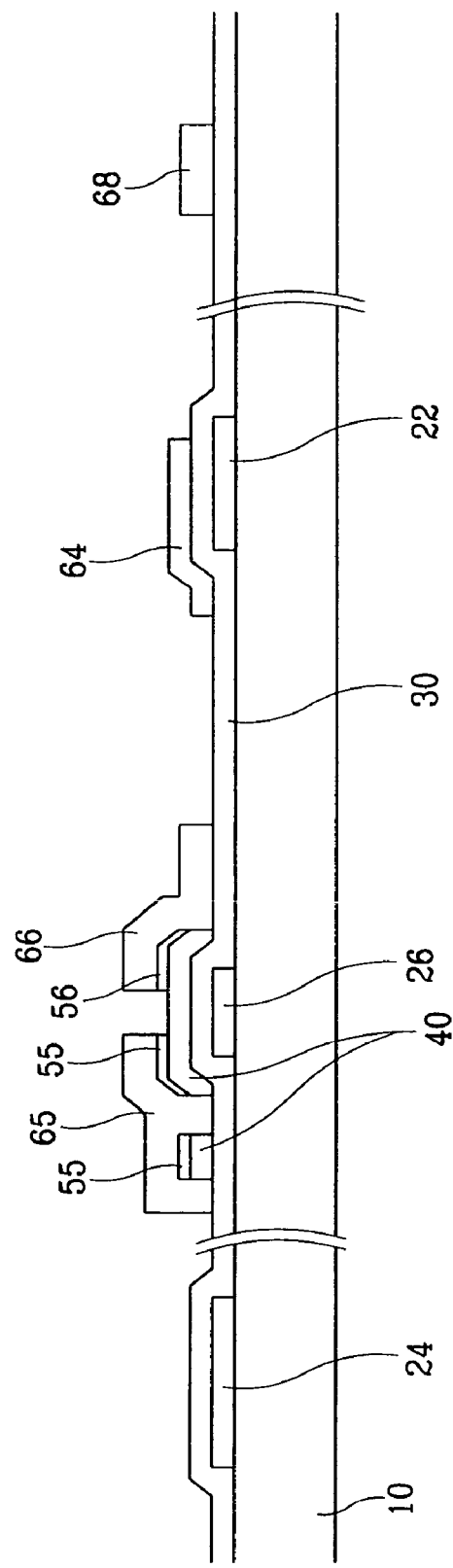
FIG. 19B is a cross sectional view of the thin film transistor array substrate taken along the XIXb-XIXb' line of FIG. 19A.

As shown in FIGS. 19A and 19B, the substrate 10 is dipped into an HF solution such that the semiconductor pattern 40 or the ohmic contact pattern 50 is HF-treated. A silver alloy-based conductive layer is deposited onto the substrate 10 through sputtering, and patterned through photolithography to thereby form a data line assembly. The data line assembly includes data lines 62 crossing over the gate lines 22, and source electrodes 65 connected to the data lines 62 while being extended over the gate electrodes 26. Data pads 68 are connected to one-sided ends of the data lines 62. Drain electrodes 66 are separately placed opposite to the source electrodes 65 around the gate electrodes 26, and storage capacitor conductive patterns 64 are overlapped with the gate lines 22. A double or triple-sourced silver alloy may be used for the data line assembly. The silver alloy is formed with a main content of silver, and an alloy content of conductive material of 0.01-20atomic % or less such as Mg, Ca, Th, Zr, Co, Ni, Ti, V, Nb, Mo, Ta, W, and Cr.

HF treatment of the silicon-based layers 40 and 50 increases the adhesive force between the silicon-based layers and the data line assembly by 20 N or more. In order to further strengthen the adhesion, the substrate 10 with the data line assembly may be annealed at 250-500° C. In this case, a silicide layer is formed between the silicon-based layers 40 and 50 and the data line assembly, which strengthens the adhesion therebetween.

Figure 20A:
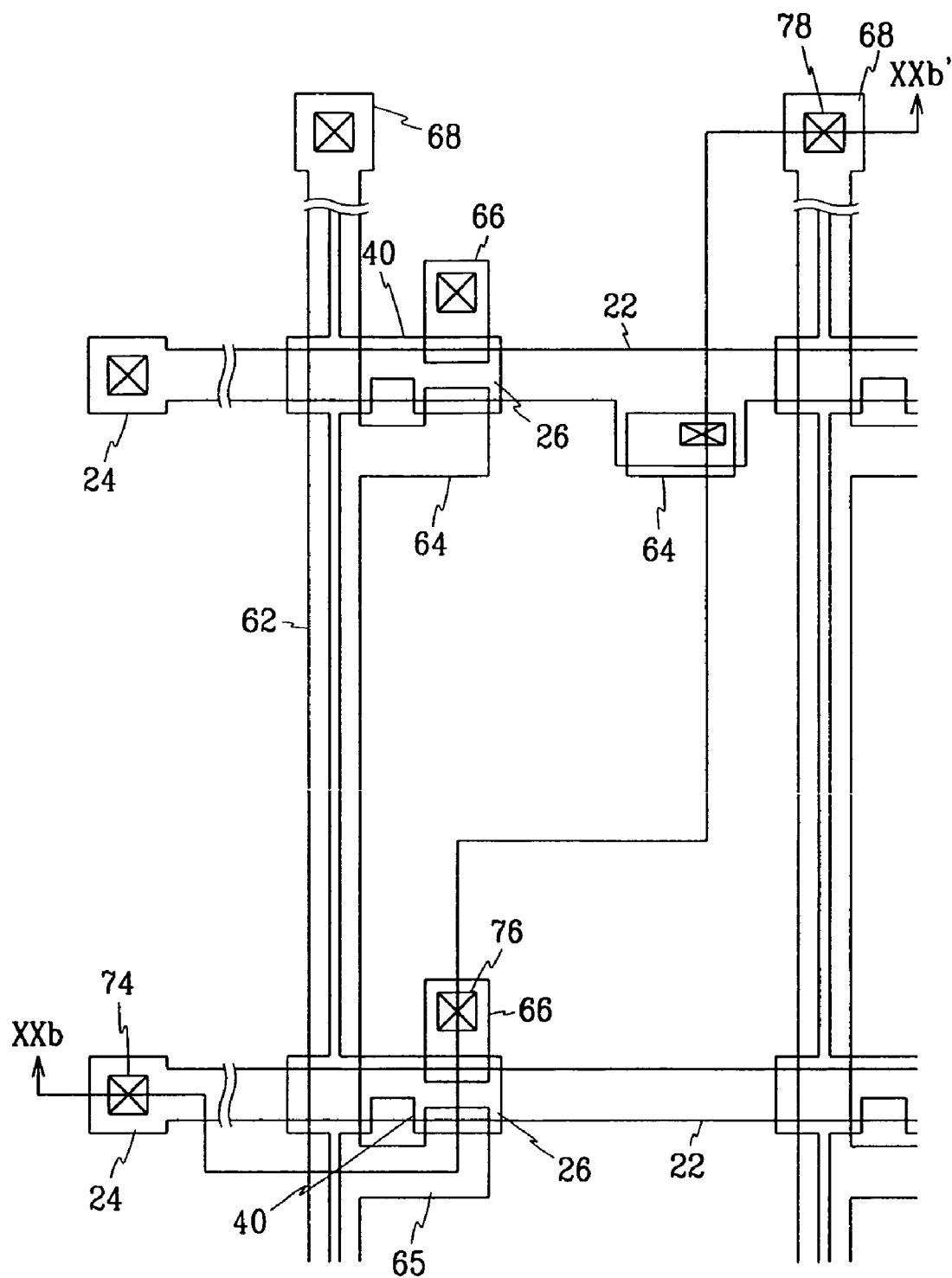
Figure 20B:
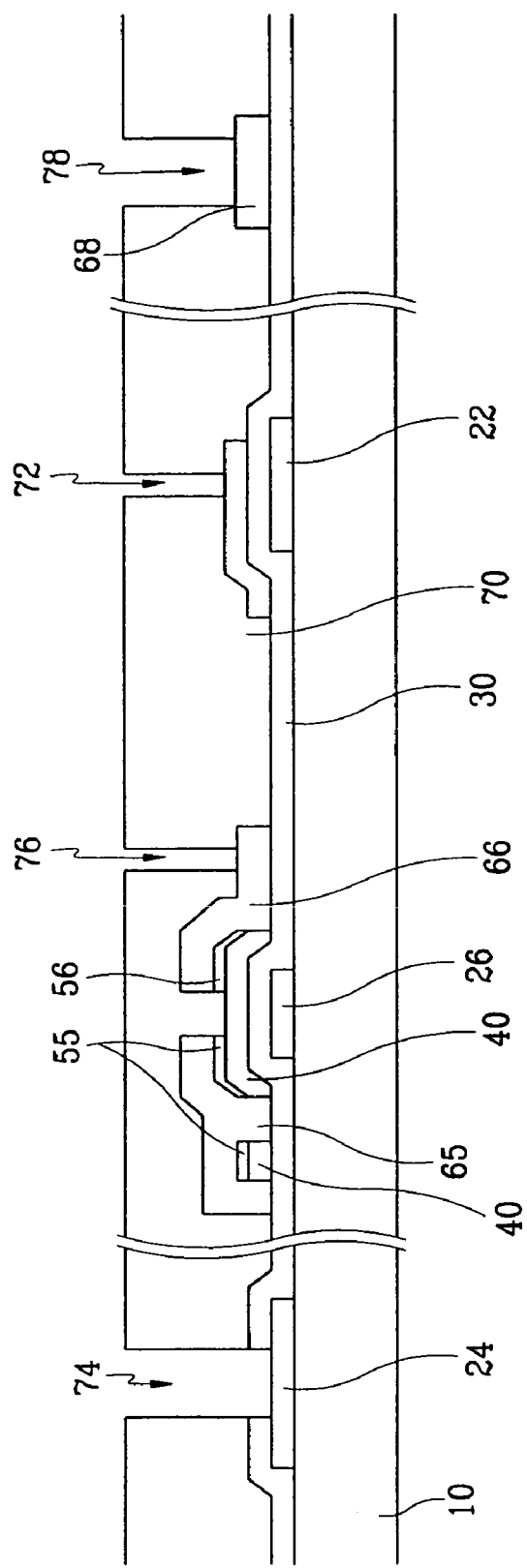
FIG. 20B is a cross sectional view of the thin film transistor array substrate taken along the XXb-XXb' line of FIG. 20A.

The ohmic contact pattern 50 exposed through the data line assembly is etched to be separated into two-sided patterns 55 and 56, to expose the underlying semiconductor pattern 40. The exposed semiconductor pattern 40 undergoes oxygen plasma treatment to stabilize the surface property. Thereafter, as shown in FIGS. 20A and 20B, an insulating material such as silicon nitride or an organic material having a low dielectric property and a good planarization characteristic is deposited onto the substrate 10 to thereby form a protective layer 70. The protective layer 70 is then patterned through dry etching together with the gate insulating layer 30 to thereby form contact holes 72, 74, 76 and 78 exposing the storage capacitor conductive patterns 64, the gate pads 24, the drain electrodes 66, and the data pads 68.

Finally, as shown in FIGS. 15 and 16, an ITO or IZO-based layer is deposited onto the substrate 10, and patterned through a mask to thereby form pixel electrodes 82, subsidiary gate pads 86, and subsidiary data pads 88. The pixel electrodes 82 are connected to the storage capacitor conductive patterns 64 and the drain electrodes 66 through the contact holes 72 and 76. The subsidiary gate pad 86 and the subsidiary data pad 88 are connected to the gate pad 24 and the data pad 68 through the contact holes 74 and 78.

This technique may be applied to a method of fabricating a thin film transistor array substrate not only with five masks but also with four masks.

Figure 21:
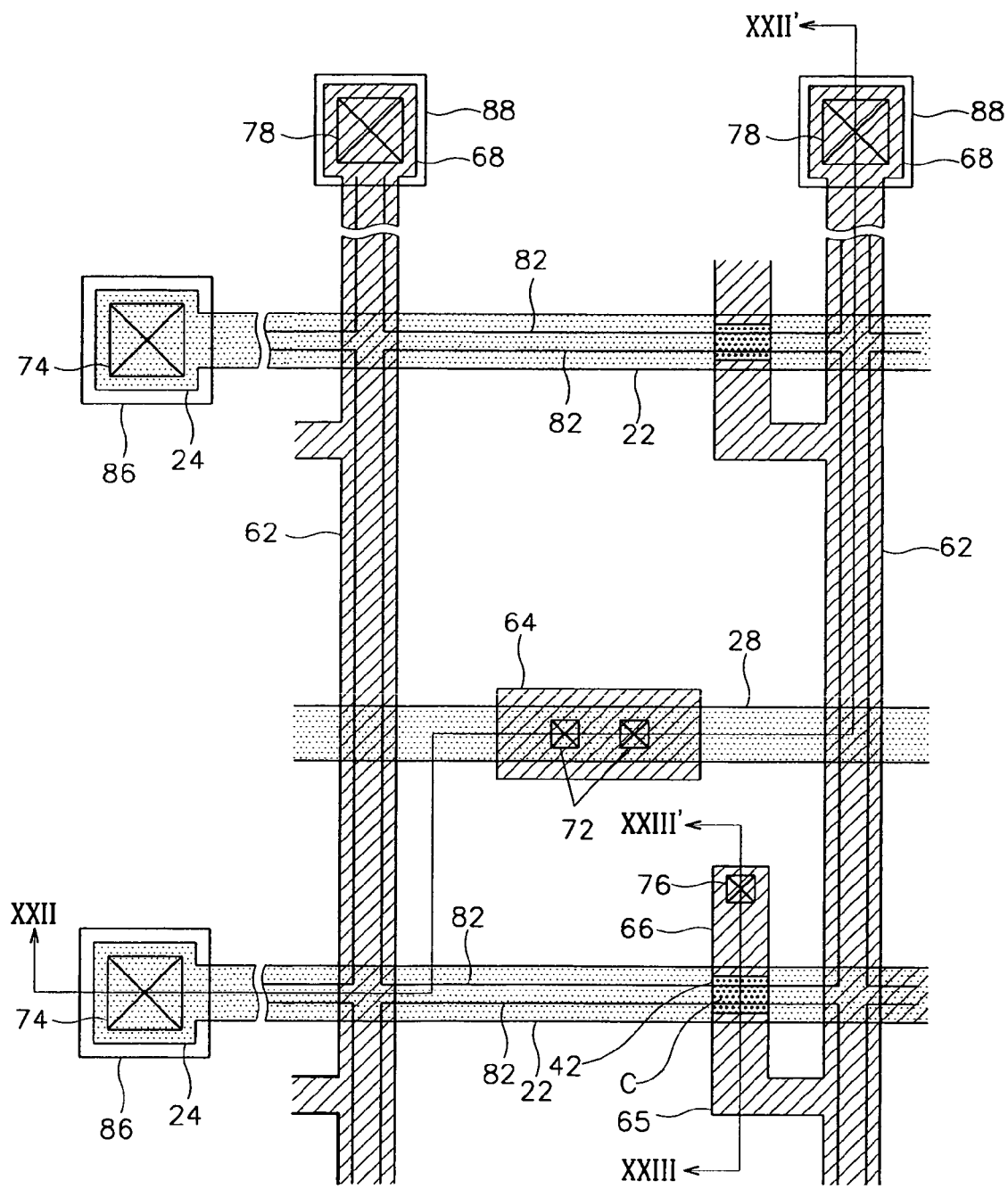
FIG. 21 is a plan view of a thin film transistor substrate for a liquid crystal display according to a second preferred embodiment of the present invention.
Figure 22:
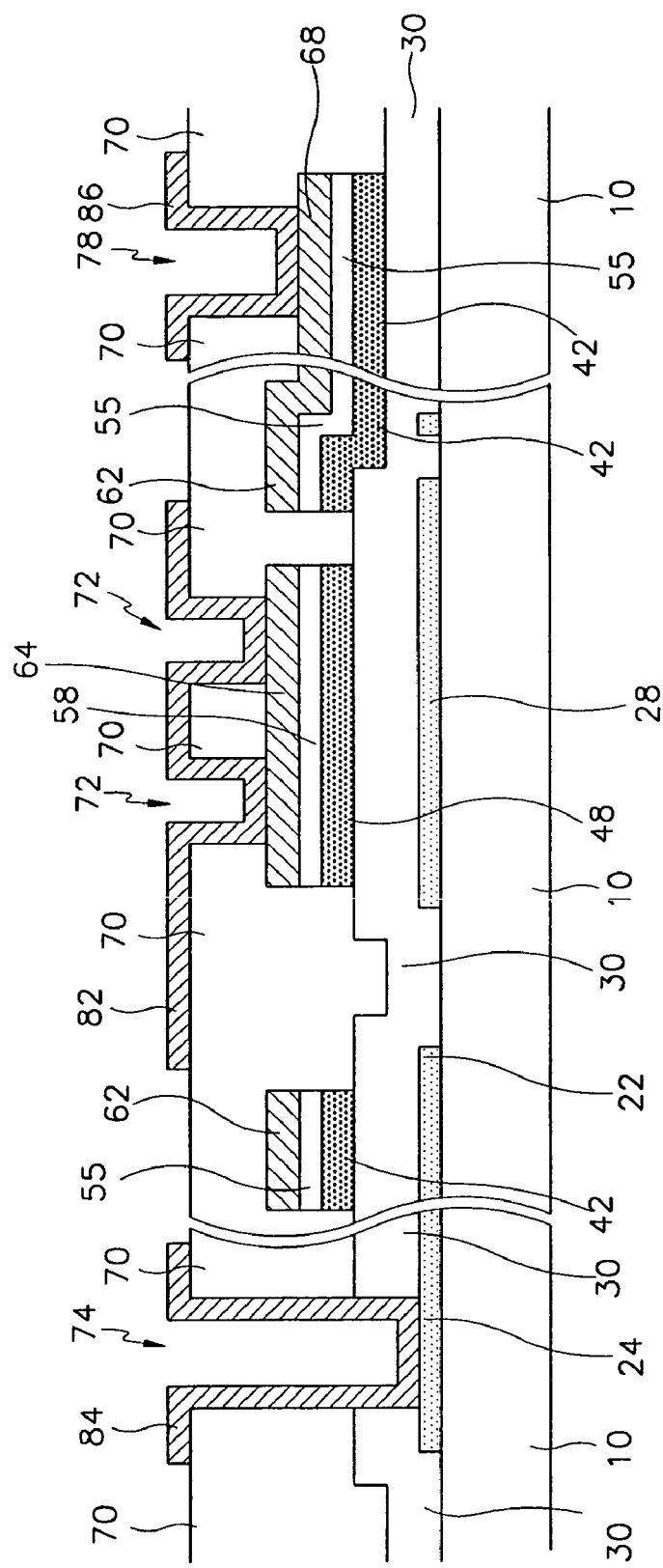
FIGS. 22 and 23 are cross sectional views of the thin film transistor array substrate shown in FIG. 21 taken along the XXII-XXII' line and the XXIII-XXIII' line of FIG. 21, respectively.
Figure 23:
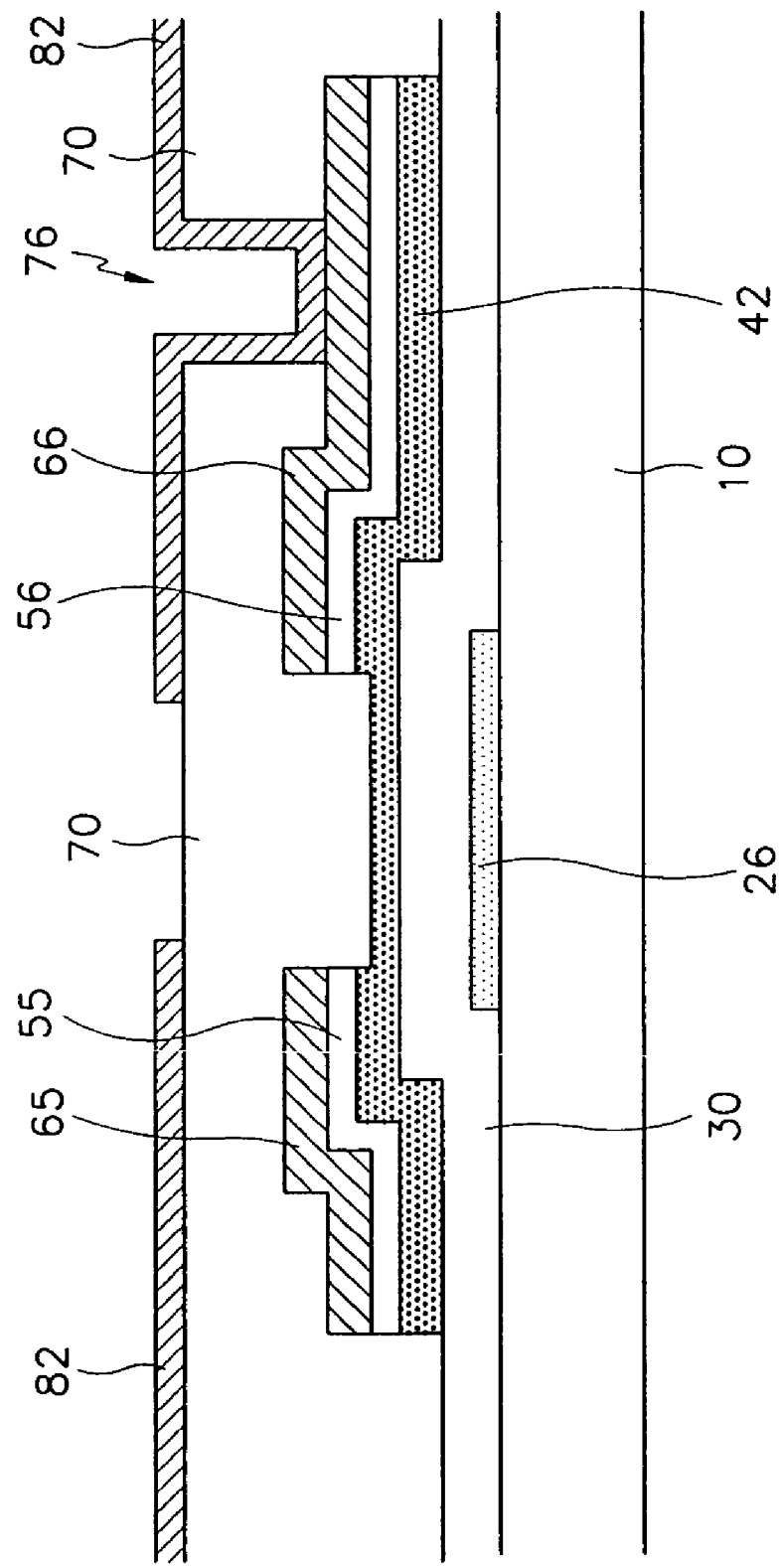

FIG. 21 is a plan view of a thin film transistor array substrate for a liquid crystal display according to a second preferred embodiment of the present invention. FIGS. 22 and 23 are cross sectional views of the thin film transistor array substrate taken along the XXII-XXII' line and the XXIII-XXIII' line of FIG. 21.

A gate line assembly is formed on an insulating substrate 10 with a silver-based conductive material. The gate line assembly includes gate lines 22, gate pads 24, and gate electrodes 26. The gate line assembly further includes storage capacitor electrodes 28 proceeding in parallel with the gate lines 22 to receive common electrode voltages from the outside. The storage capacitor electrodes 28 are overlapped with the storage capacitor conductive patterns 68 connected to pixel electrodes 82, thereby forming storage capacitors while enhancing the electric potential storage capacity of the pixels. In case the storage capacity due to the overlapping of the pixel electrodes 82 and the gate lines 22 is sufficiently high, the storage capacitor electrodes 28 may be omitted.

A gate insulating layer 30 is formed on the gate line assembly of silicon nitride and covers the gate line assembly.

Semiconductor patterns 42 and 48 are formed on the gate insulating layer 30 with hydrogenated amorphous silicon. Ohmic contact patterns 55, 56 and 58 are formed on the semiconductor patterns 42 and 48 with doped amorphous silicon where n type impurities such as phosphorous (P) are doped at high concentration.

A data line assembly is formed on the ohmic contact patterns 55, 56 and 58 with silver alloy. The data line assembly includes data lines 62 proceeding in the vertical direction, data pads 68 connected to one-sided ends of the data lines 62 to receive picture signals from the outside, and source electrodes 65 branched from the data lines 62. The data line assembly further includes drain electrodes 66 placed opposite to the source electrodes 65 around the gate electrodes 26, and storage capacitor conductive patterns 64 placed over the storage capacitor electrodes 28. In case the storage capacitor electrodes 28 are absent, the storage capacitor conductive patterns 64 may be omitted.

The data line assembly may be formed with a single layer based on aluminum or aluminum alloy, chrome, molybdenum or molybdenum alloy, tantalum, or titanium.

The ohmic contact patterns 55, 56 and 58 lower the contact resistance between the underlying semiconductor patterns 42 and 48 and the overlying data line assembly while bearing the same outline as the data line assembly. That is, the ohmic contact pattern 55 has the same outline as the data lines 62, the source electrodes 65 and the data pads 68, the ohmic contact pattern 56 has the same outline as the drain electrodes 66, and the ohmic contact pattern 58 has the same outline as the storage capacitor conductive pattern 64.

The semiconductor patterns 42 and 48 have the same outline as the data line assembly and the ohmic contact patterns 55, 56 and 58 except for the channel portion C. Specifically, the semiconductor patterns 48, the conductive patterns 64 and the ohmic contact patterns 58 for the storage capacitors have the same outline, but the TFT semiconductor patterns 42 slightly differ from the data line assembly and the corresponding ohmic contact patterns 55 and 56. That is, the source and the drain electrodes 65 and 66 are separated from each other at the channel portion C, and the ohmic contact patterns 55 for the data lines 62, the source electrodes 65 and the data pads 68, and the ohmic contact patterns 56 for the drain electrodes 66 are also separated from each other at that portion. But the TFT semiconductor patterns 42 proceed continuously there without separation while forming TFT channels.

A protective layer 70 is formed on the data line assembly with silicon nitride, an organic material bearing a lower dielectric property and a good planarization characteristic.

The protective layer 70 is provided with contact holes 72, 76 and 78 exposing the data pads 64, the drain electrodes 66, and the storage capacitor conductive patterns 68. The protective layer 70 further has contact holes 74 exposing the gate pads 24 together with the gate insulating layer 30.

Pixel electrodes 82 are formed on the protective layer 70 to receive picture signals from the TFTs and generate electric fields together with a common electrode of a counter substrate. The pixel electrodes 82 are formed with a transparent conductive material such as ITO and IZO. The pixel electrodes 82 are physico-electrically connected to the drain electrodes 66 through the contact holes 76 to receive picture signals. The pixel electrodes 82 are overlapped with the neighboring gate line 22 and data line 62 to enhance opening ratio thereof. However they may be overlapped. Furthermore, the pixel electrodes 82 are also connected to the storage capacitor conductive patterns 64 through the contact holes 72 to transmit picture signals thereto.

Meanwhile, subsidiary gate and data pads 84 and 88 are formed over the gate and data pads 24 and 68 such that they are connected to the gate and data pads 24 and 68 through the contact holes 74 and 78. The subsidiary gate and data pads 84 and 88 strengthen the of adhesion with external circuits and protect the gate and data pads 24 and 68. The subsidiary gate and data pads 84 and 88 may be used in a selective manner.

A method of fabricating the thin film transistor array substrate using four masks will be now explained with reference to FIGS. 24A, 24B, 24C, 25A, 25B, 26A, 26B, 26C, 27A, 27B, 28A, 28B, 29A, 29B, 30A, 30B and 30C.

Figure 24A:
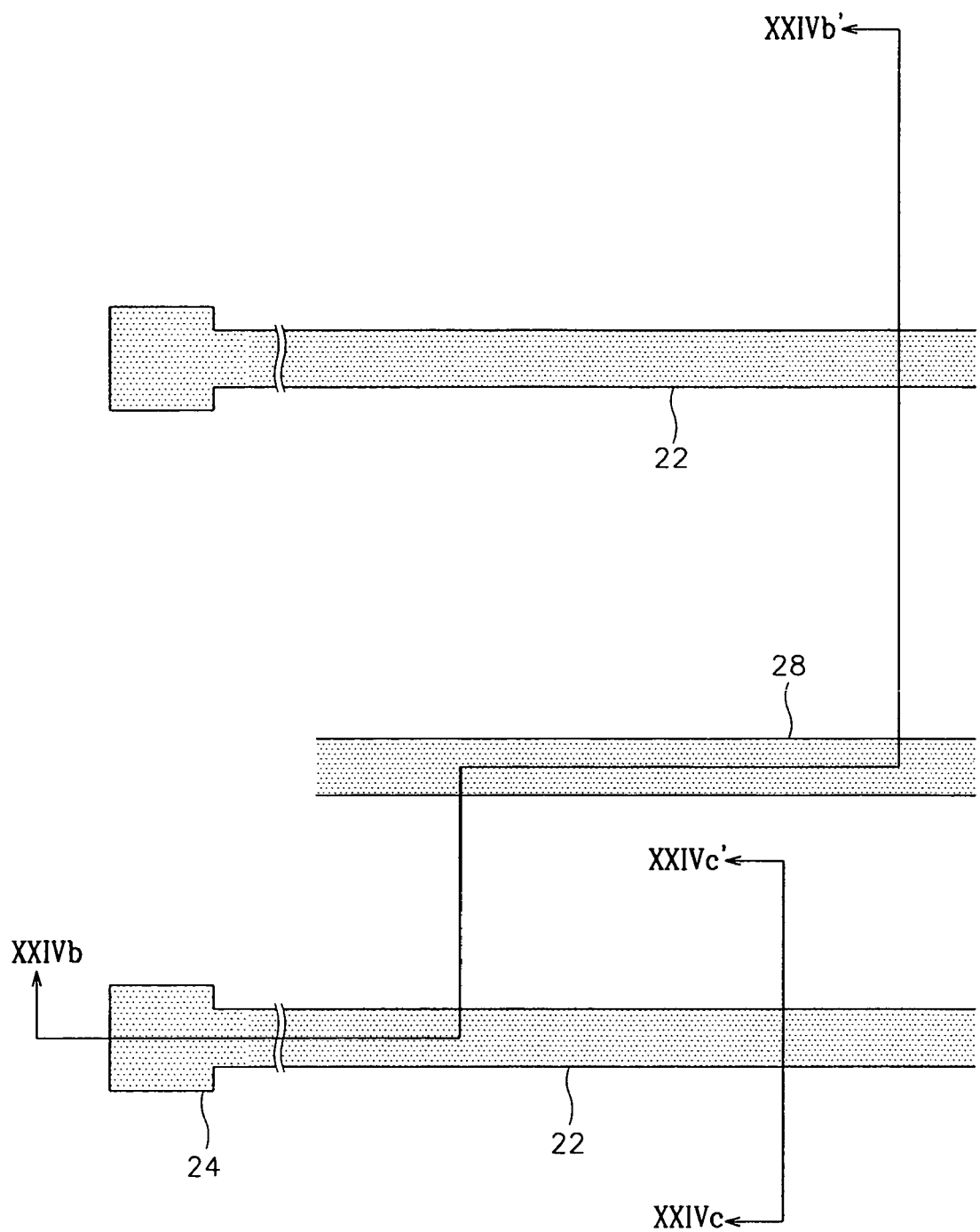
FIG. 24A illustrates the first step of fabricating the thin film transistor array substrate shown in FIG. 21.
Figure 24C:
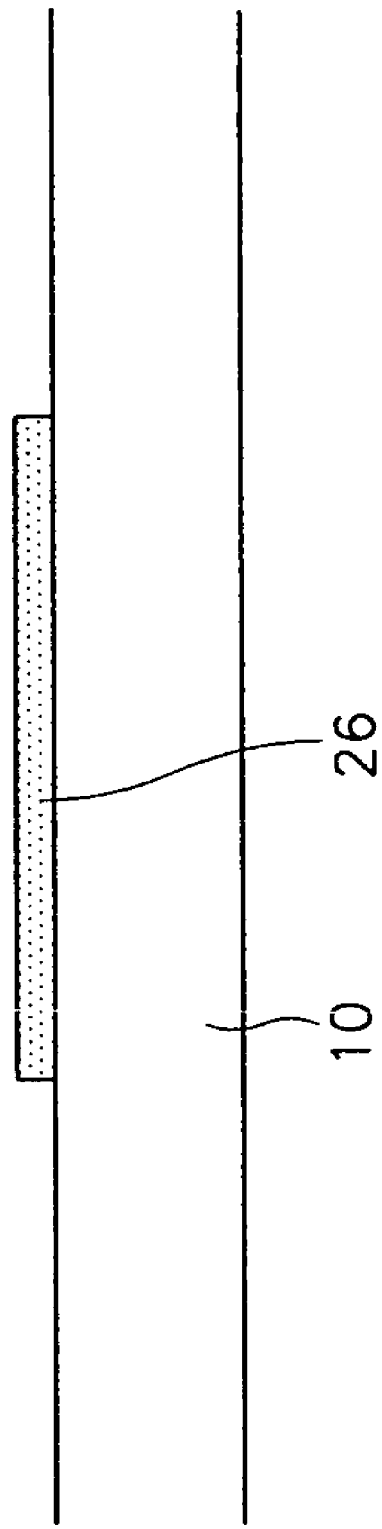

As shown in FIGS. 24A, 24B and 24C, the substrate 10 undergoes oxygen plasma treatment, and a silver or silver alloy-based conductive material is deposited onto the substrate 10. The conductive material-based layer is then patterned through photolithography to thereby form a gate line assembly. The gate line assembly includes gate lines 22, gate pads 24, gate electrodes 26, and storage capacitor electrodes 28.

Figure 25B:
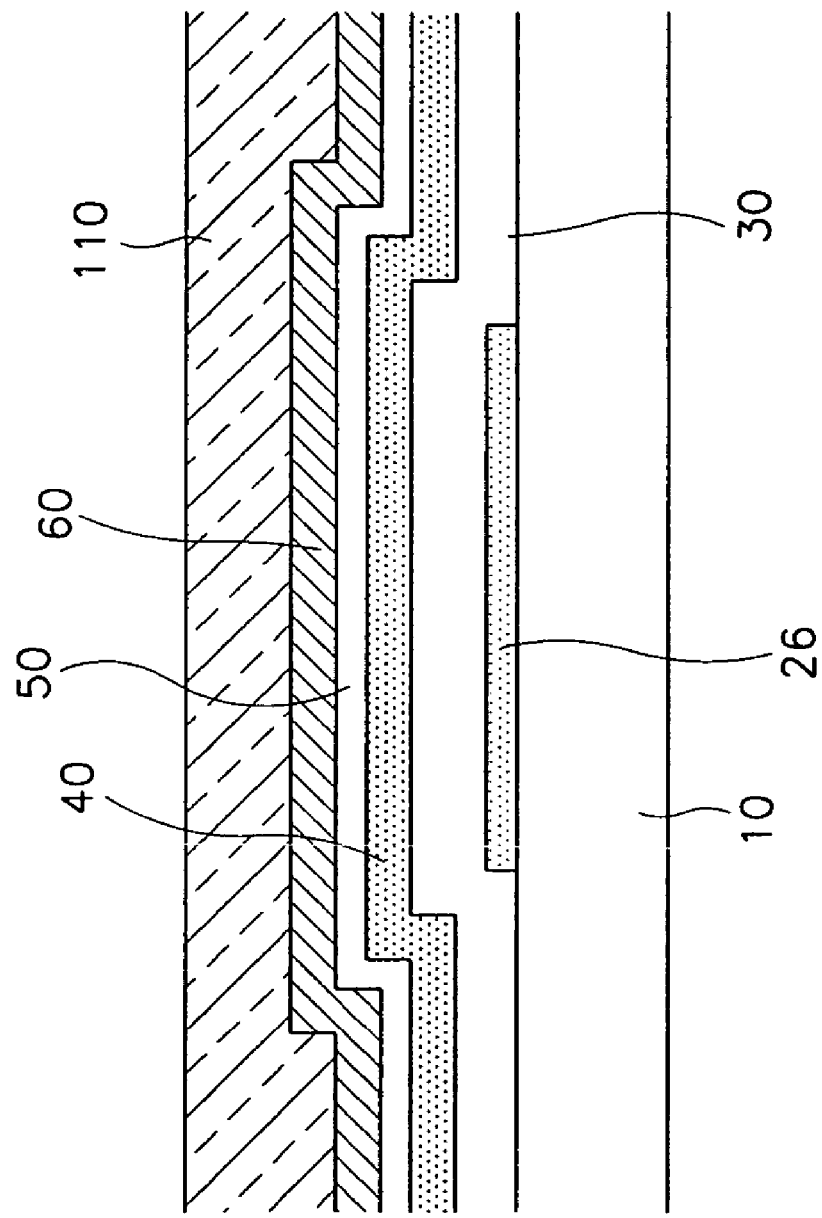

Thereafter, as shown in FIGS. 25A and 25B, a silicon nitride-based gate insulating layer 30, a semiconductor layer 40, and an ohmic contact layer 50 are sequentially deposited onto the substrate 10 to a thickness of 1500-5000 Å, 500-2000 Å, and 300-600 Å, respectively. The ohmic contact layer 50 is HF-treated, and a conductive layer 60 containing silver alloy is deposited onto the ohmic contact layer 50 through sputtering to a thickness of 1500-3000 Å. A photoresist film 110 is coated onto the conductive layer 60 with a thickness of 1-2 μm. Preferably, the gate insulating layer 30 should be deposited at 300° C. or more for five minutes.

Figure 26A:
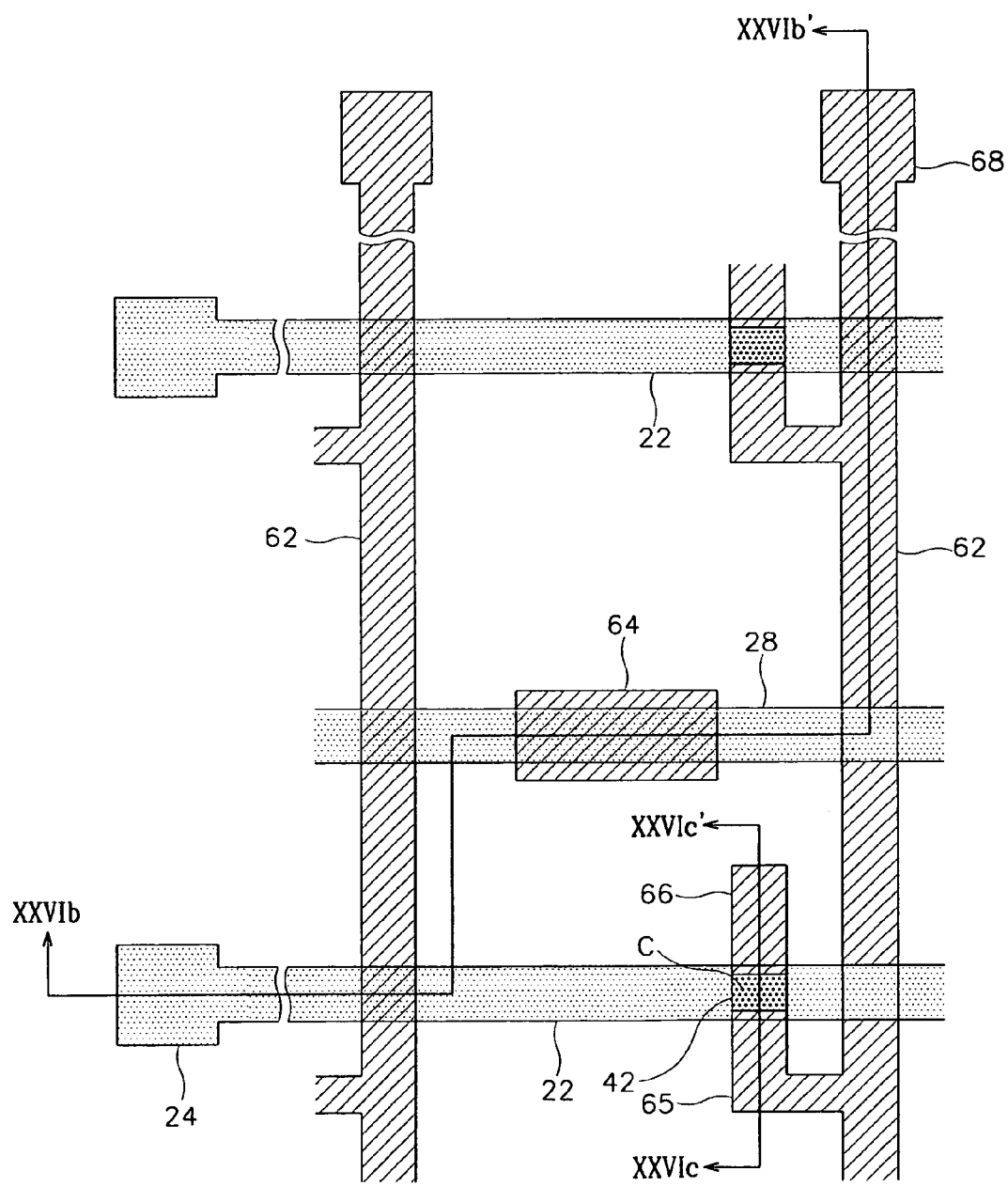
FIG. 26A illustrates the step of fabricating the thin film transistor array substrate shown in FIG. 21 following those illustrate in FIGS. 25A and 25B.
Figure 26B:
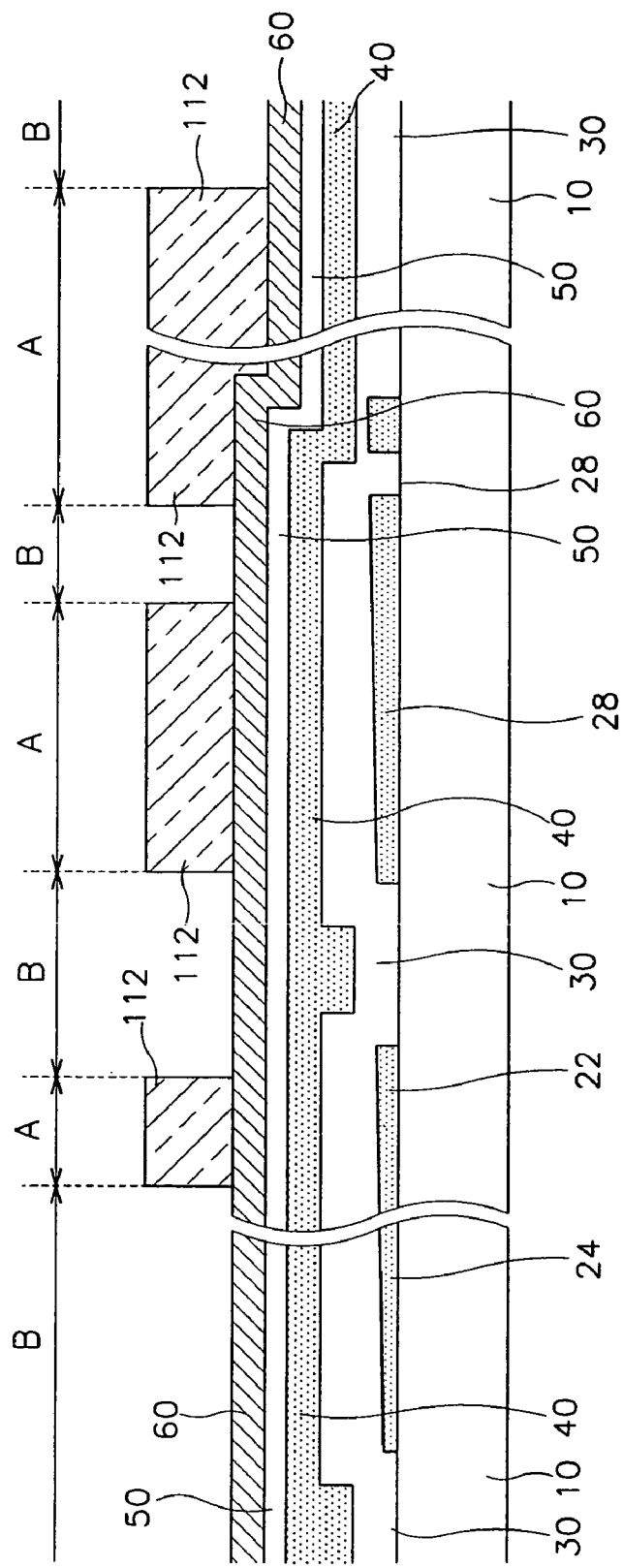

Thereafter, as shown in FIGS. 26B and 26C, the photoresist film 110 is exposed to light through a mask, and developed to thereby form a photoresist pattern 112 and 114. At this time, the first photoresist pattern portion 114 placed at the channel portion C between the source and the drain electrodes 65 and 66 has a thickness smaller than the second photoresist pattern portion 112 placed over the data line assembly. The remaining portion B of the photoresist film is all removed. The thickness ratio of the first photoresist pattern portion 114 at the channel portion C to the second photoresist pattern portion 112 at the data line assembly area A should be differentiated depending upon the etching conditions. It is preferable that the thickness ratio of the first portion 114 to the second portion 112 should be ½ or less.

For instance, the thickness of the first portion 114 may be established to be 4000 Å or less.

The thickness of the photoresist film may be locally differentiated in various ways. In order to control the light transmission at the data line assembly area A, a slit or lattice pattern, or a semitransparent film may be used.

It is preferable that the opening width of the slit pattern should be smaller than the decomposition capacity of the light exposing device. In a semitransparent film, thin films with different light transmission or thickness may be used to control light transmission.

When light is illuminated onto the photoresist film through a mask, the high molecules at the light-exposed portions are completely decomposed, and the photoresist film at the slit pattern or the semi-transparent film is partially decomposed. The photoresist film at the light interception film is not nearly decomposed. When the photoresist film is developed, the remaining photoresist film has locally different thickness. As too long exposure may decompose all of the molecules, a great deal of caution has to be exercised.

The photoresist film 114 of a relatively thin thickness may be made using a photoresist film capable of reflowing. A typical mask having a transparent portion and an opaque portion is used in light-exposing the photoresist film 114. The photoresist film 114 is developed, and reflowing is made at the photoresist film 114 such that the photoresist film content flows down to the non-film portions thereof.

Thereafter, the conductive layer 60, the ohmic contact layer 50 and the semiconductor layer 40 are etched using the photoresist pattern as a mask. As a result, the data line assembly and the underlying layers are left at the data line assembly area A, only the semiconductor layer 40 is left at the channel portion C, and only the gate insulating layer 30 is left at the remaining portion B.

Figure 27A:
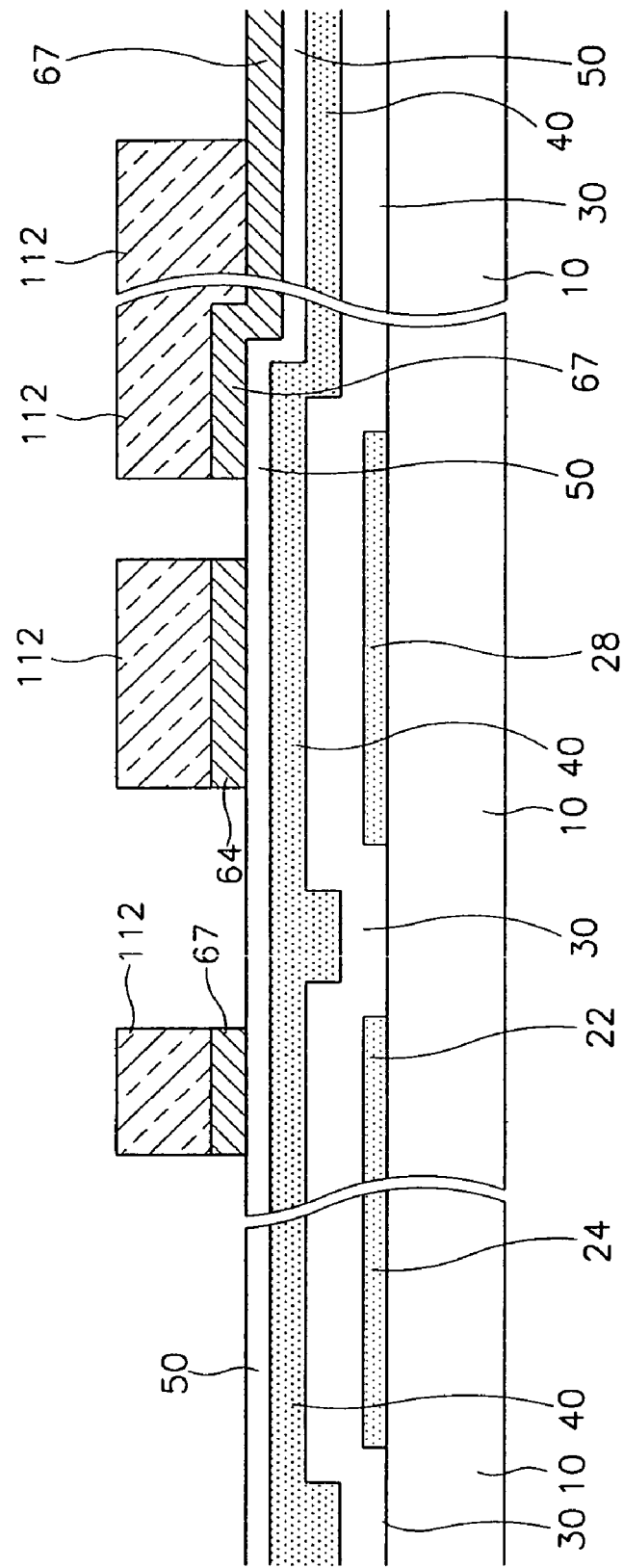
Figure 27B:
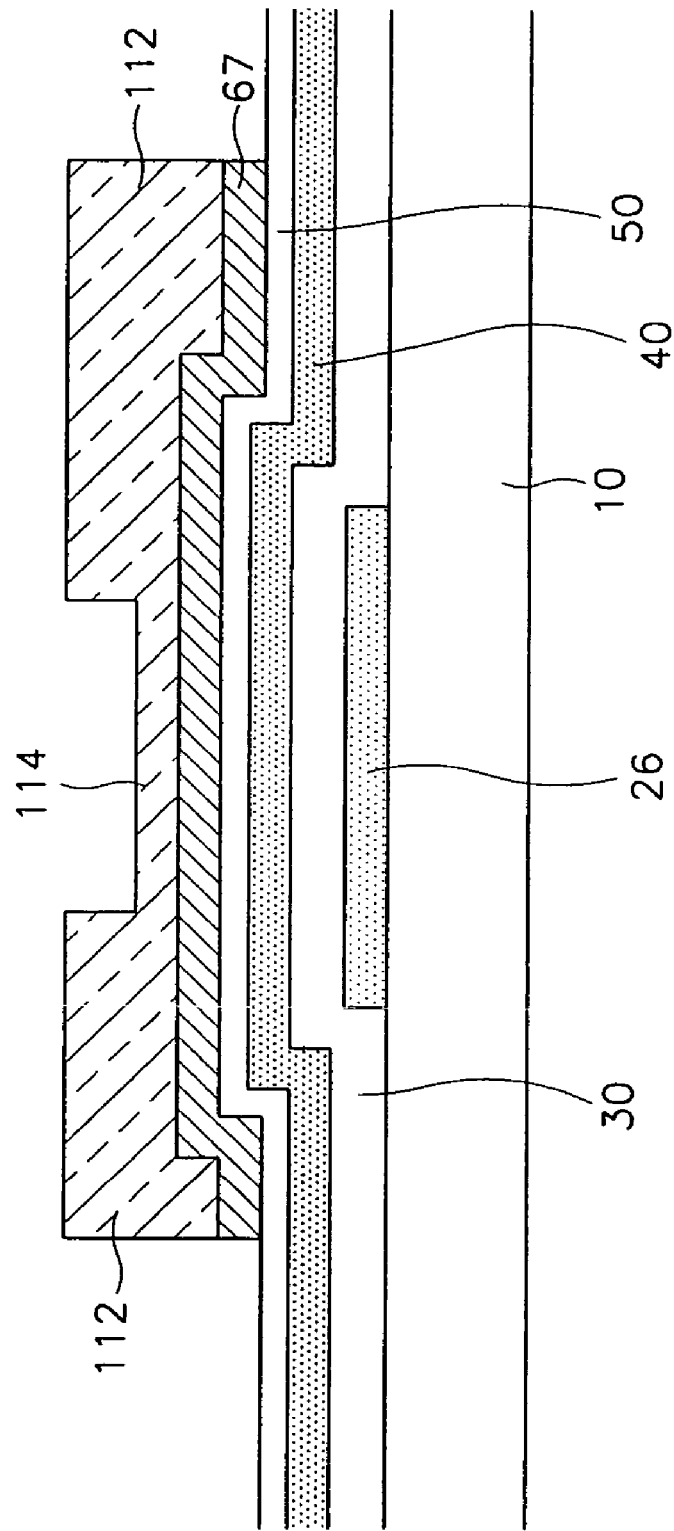

For that purpose, as shown in FIGS. 27A and 27B, the conductive layer 60 exposed at the B portion is removed and exposes the underlying ohmic contact layer 50. In this process, either dry etching or wet etching may be used to etch out the conductive layer 60 and leaving the photoresist pattern 112 and 114. However, in dry etching, it is difficult to find such an etching condition and the photoresist pattern 112 and 114 may be etched together. In this case, the thickness of the first photoresist pattern portion 114 should be thick enough to prevent the first photoresist pattern portion 114 from being entirely removed, but just to expose the underlying conductive layer 60.

In case the conductive layer 60 is Mo or MoW alloy, Al or Al alloy, or Ta, either dry etching or wet etching may be used. However, if the conductive layer 60 is formed of Cr, wet etching should be used for etching the layer because Cr is not well removed through dry etching. In the case of wet etching, $CeNHO_3$ may be used for the etching solution. If the conductive layer 60 is Mo or MoW, a mixture of $CF_4$ and HCl, or a mixture of $CF_4$ and $O_2$ may be used for the etching gas. In the latter case, the etching ratios with respect to the conductive layer and the photoresist film are nearly similar.

Consequently, as shown in FIGS. 27A and 27B, only the source/drain conductive pattern 67 and the storage capacitor conductive pattern 64 are left over, and the conductive layer 60 at the B portion is all removed and the underlying ohmic contact layer 50 is exposed. The conductive patterns 64 and 67 have the same outline as the data line assembly except that the source electrode 65 and the drain electrode 66 proceed continuously without separation. Furthermore, when dry etching, the photoresist pattern 112 and 114 is also removed to some degree.

Figure 28B:
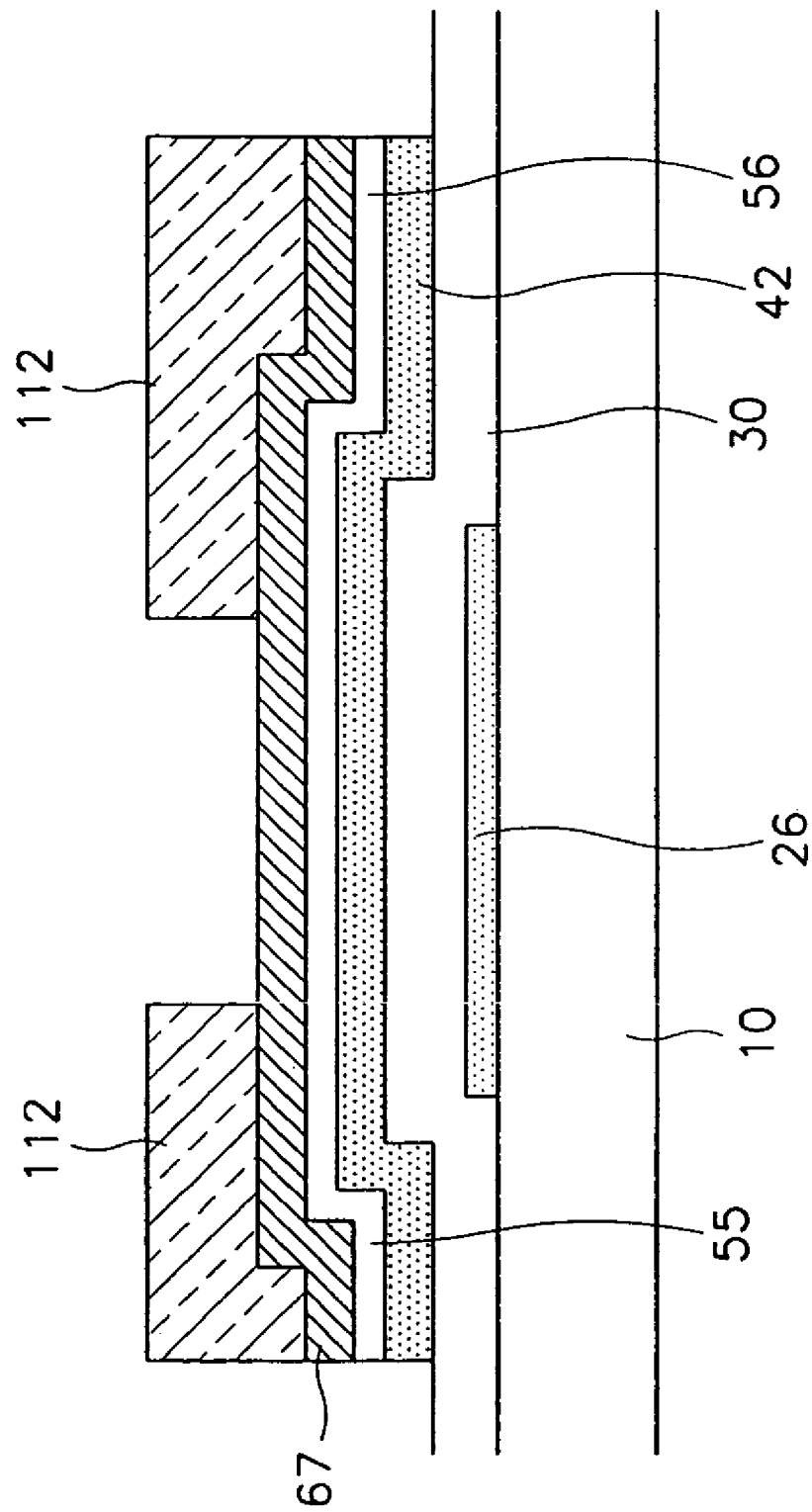

Thereafter, as shown in FIGS. 28A and 28B, the ohmic contact layer 50 exposed at the B portion, and the underlying semiconductor layer 40 are simultaneously removed through dry etching together with the first photoresist pattern portion 114. At this time, the etching should be made in condition that the photoresist pattern 112 and 114, the ohmic contact layer 50 and the semiconductor layer 40 (the semiconductor layer and the ohmic contact layer bearing no etching selectivity) are simultaneously etched while leaving out the gate insulating layer 30. Particularly, the etching ratios with respect to the photoresist pattern 112 and 114 and the semiconductor layer 40 should be preferably the same. For instance, the two layers can be etched by the same thickness using a mixture of $SF_6$ and HCl, or a mixture of $SF_6$ and $O_2$. In case the etching ratios with respect to the photoresist pattern 112 and 114 and the semiconductor layer 40 are the same, the thickness of the first photoresist pattern portion 114 should be the same as, or smaller than the sum in thickness of the semiconductor layer 40 and the ohmic contact layer 50.

Consequently, as shown in FIGS. 28A and 28B, the first photoresist pattern portion 114 at the C area is removed while exposing the source/drain conductive pattern 67. The ohmic contact layer 50 and the semiconductor layer 40 at the B area are removed while exposing the underlying gate insulating layer 30. The second photoresist pattern portion 112 at the A area is also etched while being reduced in thickness. In this process, the semiconductor patterns 42 and 48 are completed. Reference numerals 57 and 58 indicate the ohmic contact pattern placed under the source/drain conductive pattern 67, and the ohmic contact pattern placed under the storage capacitor conductive pattern 64, respectively.

The residual photoresist film on the source/drain conductive pattern 67 is removed through ashing.

Figure 29A:
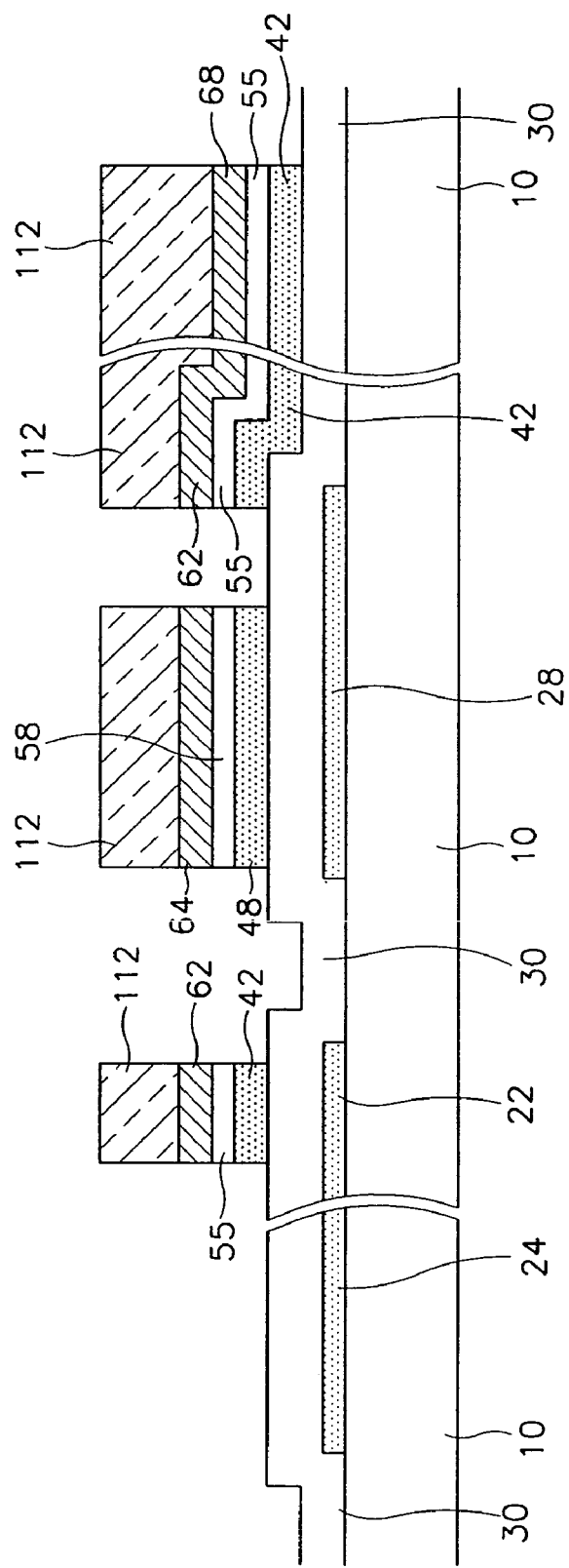
Figure 29B:
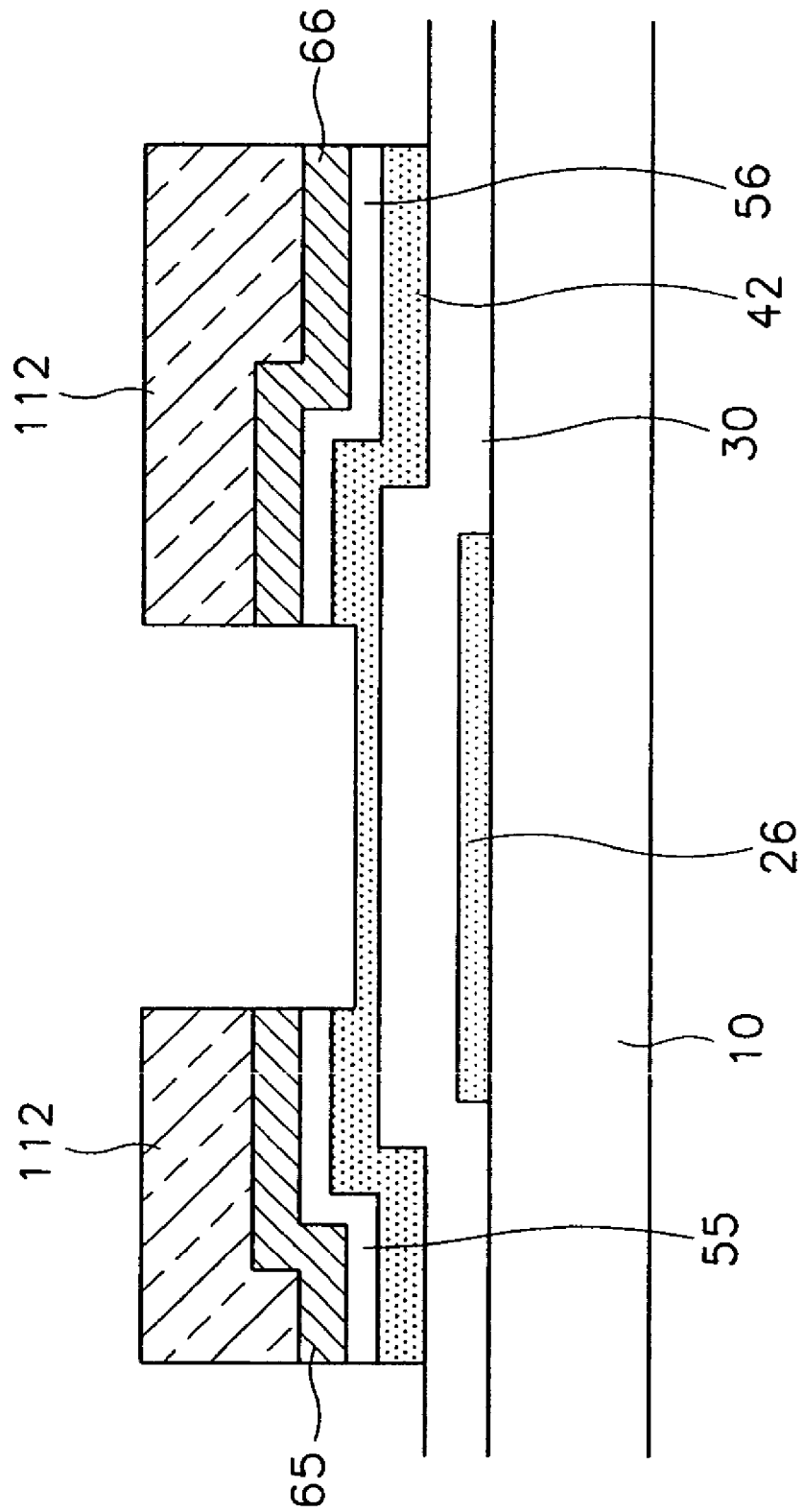

Thereafter, as shown in FIGS. 29A and 29B, the source/drain conductive pattern 67 at the channel portion C and the underlying ohmic contact pattern 57 are removed through etching. Both the source/drain conductive pattern 67 and the ohmic contact pattern 57 may be dry-etched. Alternatively, the source/drain conductive pattern 67 is wet-etched and the ohmic contact pattern 57 is dry-etched. In the former case, the patterns should be preferably etched in a condition that the etching selection ratios with respect to the source/drain conductive pattern 67 and the ohmic contact pattern 57 are high. In case the etching selection ratios are low, it becomes difficult to find the end point of etching while making it difficult to control the thickness of the semiconductor pattern 42 to be left at the channel portion C. For instance, the source/drain conductive pattern 67 may be etched using a mixture of $SF_6$ and $O_2$. In case the wet etching and the dry etching are alternated, the side portion of the source/drain conductive pattern 67 undergoing the wet etching is etched, but the ohmic contact pattern 57 undergoing the dry etching is not nearly etched so that a stepped portion is made. A mixture of $CF_4$ and HCl, or a mixture of $CF_4$ and $O_2$ may be used for the etching gas. Under the application of a mixture of $CF_4$ and $O_2$, the resulting semiconductor pattern 42 may have even thickness. As shown in FIG. 22B, the semiconductor pattern 42 may be partially removed while being reduced in thickness. The second photoresist pattern portion 112 is also etched to some degree. At this time, it should be conditioned that the gate insulating layer 30 is not etched. The photoresist pattern should be thick enough not to expose the data line assembly when the second photoresist pattern portion 112 is etched.

As a result, the source and the drain electrodes 65 and 66 are separated from each other so that the data line assembly and the underlying ohmic contact patterns 55, 56 and 58 are completed.

Finally, the second photoresist pattern portion 112 left over the data line assembly area A is removed. However, the second photoresist pattern portion 112 may be removed after the source/drain conductive pattern 67 at the channel area C is removed while leaving out the underlying ohmic contact pattern 57.

As described above, the wet etching and the dry etching may be alternated, or only the dry etching may be used. The latter case may simplify the relevant processing steps, but it becomes difficult to find the correct etching condition. By contrast, in the former case, it is easy to find such a correct etching condition, but complicated processing steps are involved.

Meanwhile, the subsrate may be annealed at 250-500° C. to strengthen the adhesion between the data line assembly and the underlying layer. Such an annealing process may be performed directly after depositing the data line assembly conductive layer, or after completing the data line assembly. If the substrate is annealed, the HF treatment process may be omitted.

Figure 30A:
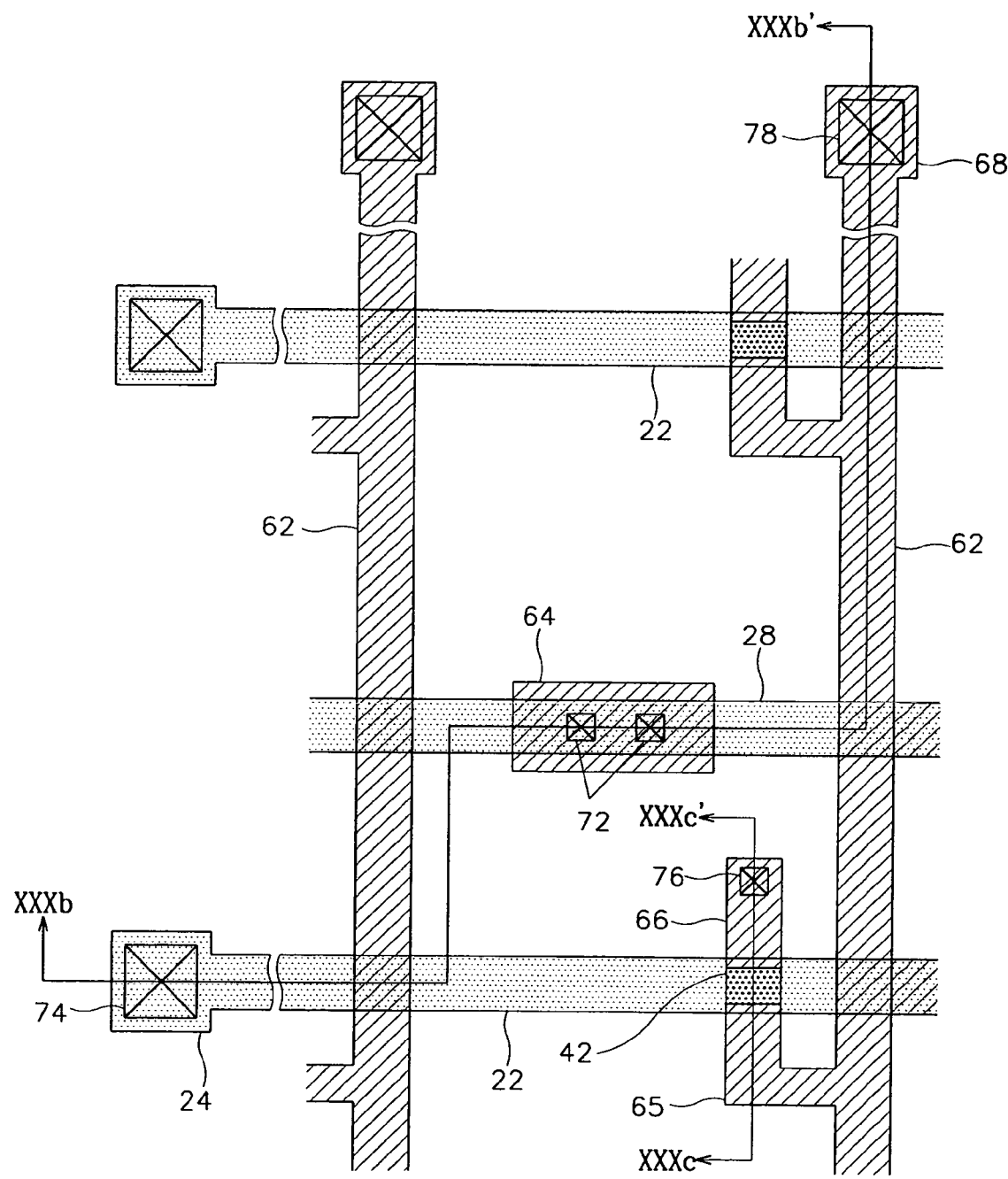
FIG. 30A illustrates the step of fabricating the thin film transistor array substrate shown in FIG. 21 following those illustrate in FIGS. 29A and 29B.
Figure 30C:
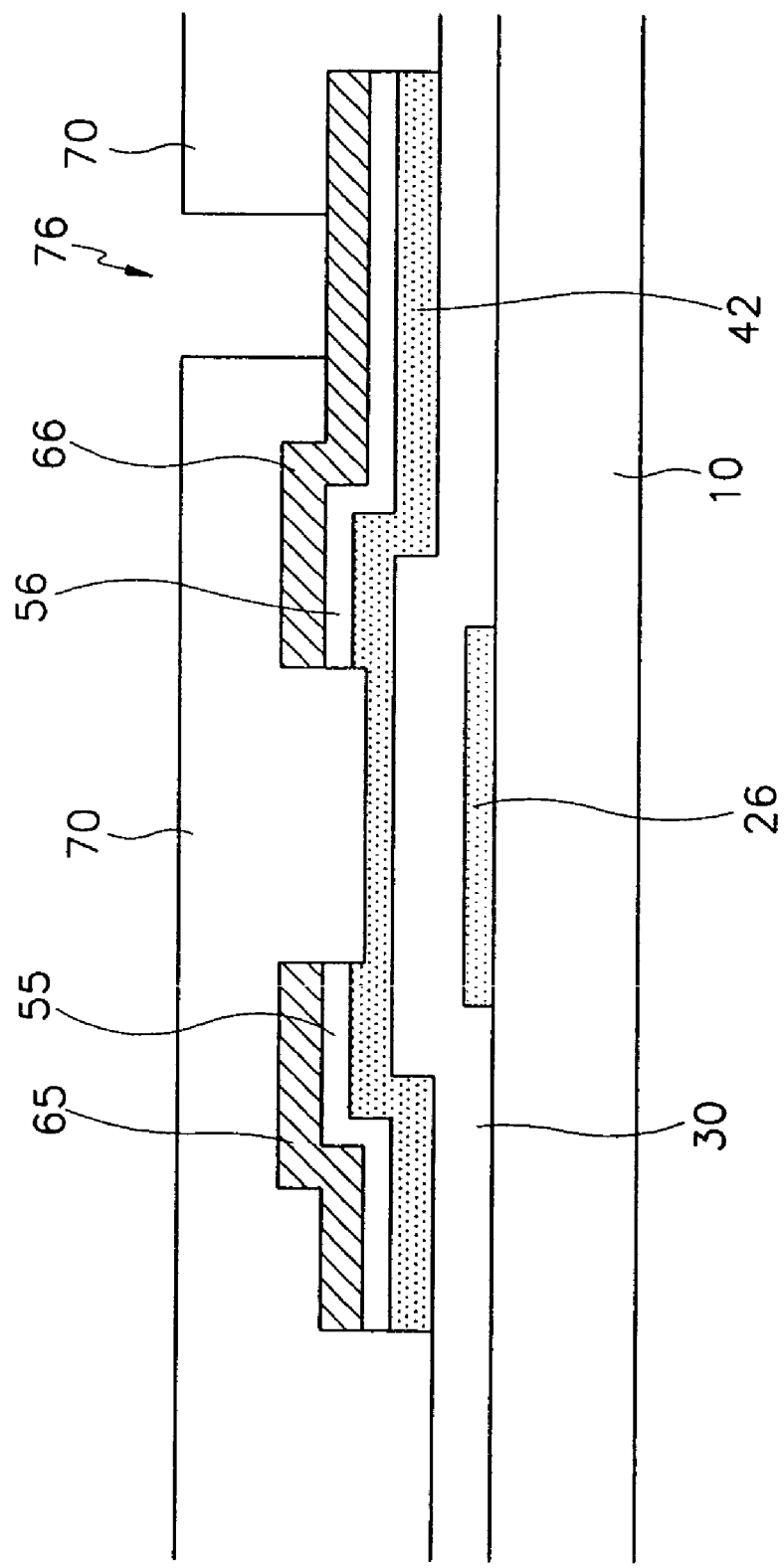

After the completion of the data line assembly, as shown in FIGS. 30A and 30B, silicon nitride or an organic insulating material is deposited onto the substrate 10 to thereby form a protective layer 70. The protective layer 70 is etched using a mask together with the gate insulating layer 30 to thereby form contact holes 72, 74, 76 and 78 exposing the storage capacitor conductive patterns 64, the gate pads 24, the drain electrodes 66, and the data pads 68, respectively.

Finally, as shown in FIGS. 21, 22, 23 and 24, an IZO or ITO-based layer bearing a thickness of 400-500 Å is deposited onto the substrate 10, and etched through a mask to thereby form pixel electrodes 82, subsidiary gate pads 84, and subsidiary data pads 88. The pixel electrodes 82 are connected to the drain electrodes 66 and the storage capacitor conductive patterns 64. The subsidiary gate pad 86 and the subsidiary data pad 88 are connected to the gate pad 24 and the data pad 68, respectively. The data line assembly and the underlying ohmic contact patterns 55, 56 and 58 and semiconductor patterns 42 and 48 may be formed using only one mask. In this process, the source and the drain electrodes 65 and 66 are separated from each other while simplifying the relevant processing steps.

As described above, before the deposition of the conductive material, the glass substrate undergoes oxygen plasma treatment, or the silicon-based layer is HF treated. Furthermore, the silver alloy-based conductive layer is deposited onto the silicon-based layer, and annealed. This strengthens the adhesion between the silver or silver alloy-based thin film and the glass substrate or the silicon-based layer. Furthermore, the signal delay can be minimized while producing a liquid crystal display of wide screen and high resolution.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thin film transistor (TFT) array substrate, comprising:
a substrate that has been oxygen plasma treated;
a gate wiring pattern formed on the substrate and including a gate line and a gate electrode;
a gate insulating layer covering the gate wiring pattern;
a semiconductor layer formed on the gate insulating layer and having been subjected to HF treatment;
a data wiring pattern formed on the gate insulating layer and including a data line, a source electrode and a drain electrode; and
a pixel electrode connected to the drain electrode,
wherein at least one of the gate line and the data line is formed of silver or a silver alloy with an adhesion strength of about 7 Newtons (N) or greater and wherein at least one of the gate line formed on the substrate and the data line formed on the the gate insulating layer is annealed.

2. The TFT array substrate of claim 1, wherein the silvery alloy comprises a main content of silver (Ag) and an alloy content of a conductive material at about 0.01-20 atomic percent, the alloy content including one or more conductive material components selected from the group consisting of Pd, Cu, Mg, Al, Li, Pu, Np, Ce, Eu, Pr, Ca, La, Nb, Nd, and Sm.

3. The TFT array substrate of claim 1, wherein the silver alloy comprises a main content of silver (Ag) and an alloy content of a conductive material at about 0.01-20 atomic percent, the alloy content including one or more conductive material components selected from the group consisting of Mg, Ca, Th, Zr, Co, Ni, Ti, V, Nb, Mo, Ta, W, and Cr.

4. The TFT array substrate of claim 1, further comprising a protective layer covering the semiconductor layer.

5. The TFT array substrate of claim 4, wherein the pixel electrode is formed on the protective layer.

6. The TFT array substrate of claim 4, further comprising an ohmic contact layer formed between the semiconductor layer and the data line and the drain electrode.

7. The TFT array substrate of claim 6, wherein the semiconductor layer has a similar outline as the data line and the drain electrode except for a channel portion between the source electrode and the drain electrode.

8. The TFT array substrate of claim 1, wherein the pixel electrode is formed of a transparent conductive material.

9. The TFT array substrate of claim 8, further comprising a subsidiary gate pad and a subsidiary data pad placed at he same plane as the pixel electrode and electrically connected to the gate line and the data line, respectively.

10. A thin film transistor (TFT) array substrate, comprising:
a substrate;
a gate wiring pattern formed on the substrate and including a gate line and a gate electrode;
a gate insulating layer covering the gate wiring pattern; a semiconductor layer formed on the gate insulating layer and having been subjected to HF treatment;
a data wiring pattern formed on the gate insulating layer and including a data line, a source electrode and a drain electrode; and
a pixel electrode connected to the drain electrode,
wherein the data line is formed of silver or a silver alloy with an adhesion strength of about 7 Newtons (N) or greater and wherein at least one of the gate line formed on the substrate and the data line formed on the gate insulating layer is annealed.

11. The TFT array substrate of claim 10, wherein the silver alloy comprises a main content of silver (Ag) and an alloy content of a conductive material at about 0.01-20 atomic percent, the alloy content including one or more conductive material components selected from the group consisting of Pd, Cu, Mg, Al, Li, Pu, Np, Ce, Eu, Pr, Ca, La, Nb, Nd, and Sm.

12. The TFT array substrate of claim 10, wherein the silver alloy comprises a main content of silver (Ag) and an alloy content of a conductive material at about 0.01-20 atomic percent, the alloy content including one or more conductive material components selected from the group consisting of Mg, Ca, Th, Zr, Co, Ni, Ti, V, Nb, Mo, Ta, W, and Cr.

13. The TFT array substrate of claim 10, wherein the semiconductor layer is subjected to HF treatment.

14. The TFT array substrate of claim 10, wherein the data wiring pattern is annealed following being formed on the gate insulating layer.

15. The TFT array substrate of claim 10, wherein the substrate has been oxygen plasma treated.

16. A thin film transistor(TFT) array substrate, comprising:
   a substrate treated by an oxygen plasma;
   a gate wiring pattern formed on the substrate and including a gate line and a gate electrode;
   a gate insulating layer covering the gate wiring pattern;
   a semiconductor layer formed on the gate insulating layer and having been subjected to HF treatment;
   a semiconductor layer formed on the gate insulating layer;
   a data wiring pattern including a data line, a source electrode and a drain electrode; and
   a pixel electrode connected to the drain electrode,
   wherein at least one of the gate wiring pattern and the data wiring pattern is formed of silver or silver alloy with an adhesion strength of about 7 Newtons (N) or greater and at least one of the gate wiring pattern formed on the substrate and the data wiring pattern formed on the gate insulating layer is annealed.

17. The TFT array substrate of claim 16, wherein at least one of the gate wiring pattern and the data wiring pattern is annealed at about 250~500° C. for about 30~120 minutes.

18. The TFT array substrate of claim 16, wherein the oxygen plasma treatment is performed under a pressure of about 1~100 torr.

* * * * *